(12) United States Patent  
Nakajima et al.

(10) Patent No.: US 6,700,194 B2
(45) Date of Patent: Mar. 2, 2004

(54) SEMICONDUCTOR DEVICE

(75) Inventors: Dai Nakajima, Tokyo (JP); Hideaki Chuma, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/108,463

(22) Filed: Mar. 29, 2002

(65) Prior Publication Data

US 2002/0190374 A1 Dec. 19, 2002

(30) Foreign Application Priority Data

Jun. 19, 2001 (JP) .................................. 2001-184756

(51) Int. Cl.[7] .............................................. H01L 23/34
(52) U.S. Cl. ...................... 257/707; 257/706; 257/701; 257/787; 257/796
(58) Field of Search ............................... 257/787, 784, 257/796, 690, 701, 706, 707

(56) References Cited

U.S. PATENT DOCUMENTS

| | | | | |
|---|---|---|---|---|
| 5,559,374 A | * | 9/1996 | Ohta et al. | 257/723 |
| 5,646,445 A | * | 7/1997 | Masumoto et al. | 257/723 |
| 5,751,058 A | * | 5/1998 | Matsuki | 257/692 |
| 5,920,119 A | * | 7/1999 | Tamba et al. | 257/718 |
| 6,236,110 B1 | * | 5/2001 | Muto et al. | 257/724 |
| 6,291,880 B1 | * | 9/2001 | Ogawa et al. | 257/723 |
| 6,369,411 B2 | * | 4/2002 | Matsumoto | 257/182 |
| 2002/0034087 A1 | * | 3/2002 | Suzuki et al. | 363/144 |
| 2002/0113302 A1 | * | 8/2002 | Shinohara | 257/678 |

FOREIGN PATENT DOCUMENTS

| | | |
|---|---|---|
| JP | 56-32456 | 3/1981 |
| JP | 4-76046 | 7/1992 |
| JP | WO98/10508 | 3/1998 |
| JP | 10-289970 | 10/1998 |

* cited by examiner

Primary Examiner—Nathan J. Flynn
Assistant Examiner—Pershelle Greene
(74) Attorney, Agent, or Firm—Oblon, Spivak, McClelland, Maier & Neustadt, P.C.

(57) ABSTRACT

A semiconductor device which satisfies both the requirements for radiation performance and for miniaturization while having a semiconductor element for a heavy current. The semiconductor device has an IGBT element (1) and diode element (2) which are provided on the main surface of the heat spreader (25) in a strip form formed of a metal with excellent heat conductivity and electricity conductivity. In addition, a relay terminal block (20) is provided outside of the IGBT element (1) on the main surface of the heat spreader (25) and the relay terminal block (20), the IGBT element (1) and the diode element (2) are aligned. Then, the external connection electrode plates (81) and (82) are, respectively, provided on both sides of this alignment. The heat spreader (25), the IGBT element (1), the diode element (2), the relay terminal block (20) and the external connection electrode plate (8) are sealed in a resin of a box shape by using transfer molding and the resin package (23) defines the external form of the semiconductor device (M100).

18 Claims, 16 Drawing Sheets

F I G. 1
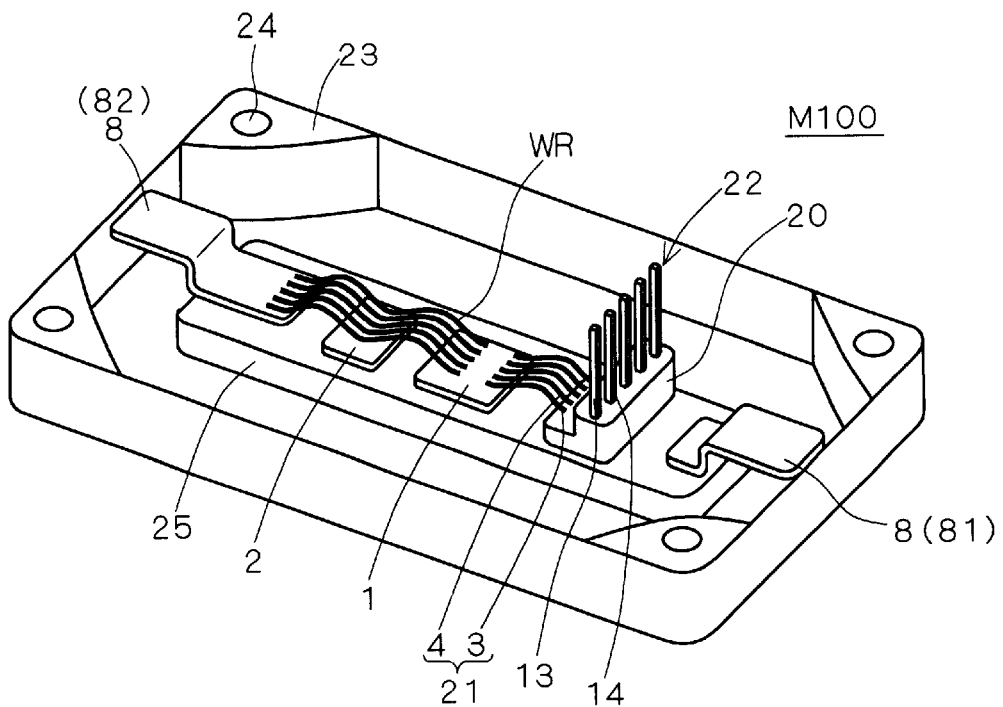
F I G. 2
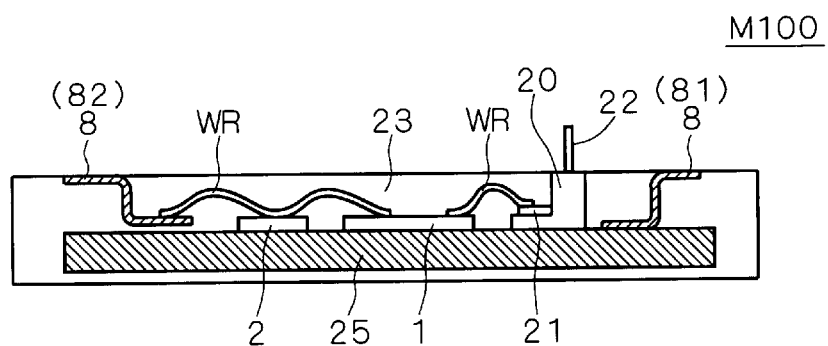

F I G. 1 1
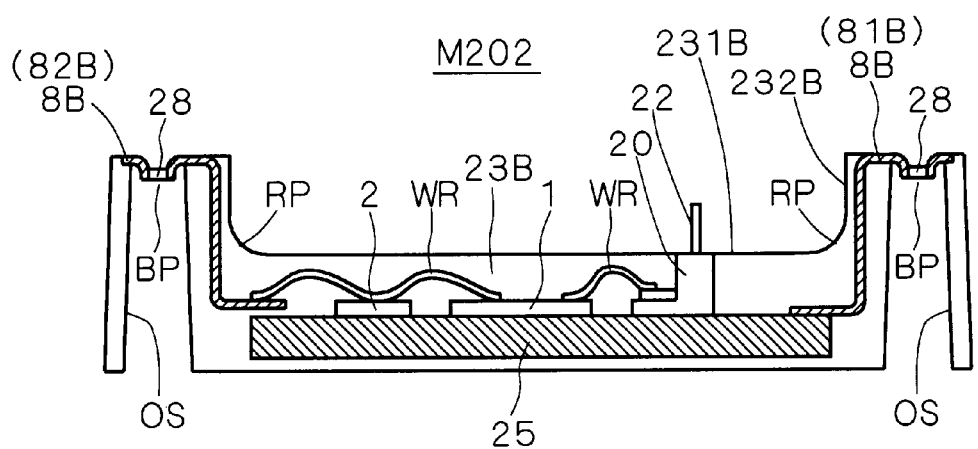
F I G. 1 2
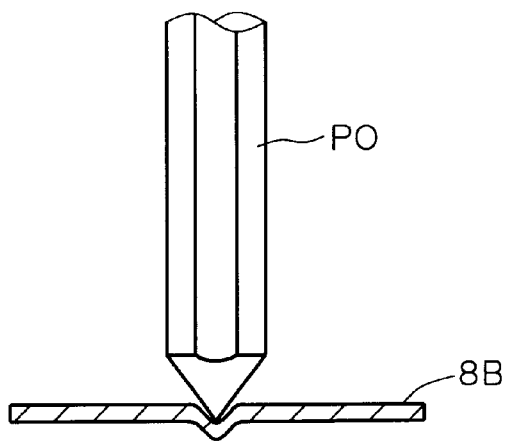

F I G. 1 8
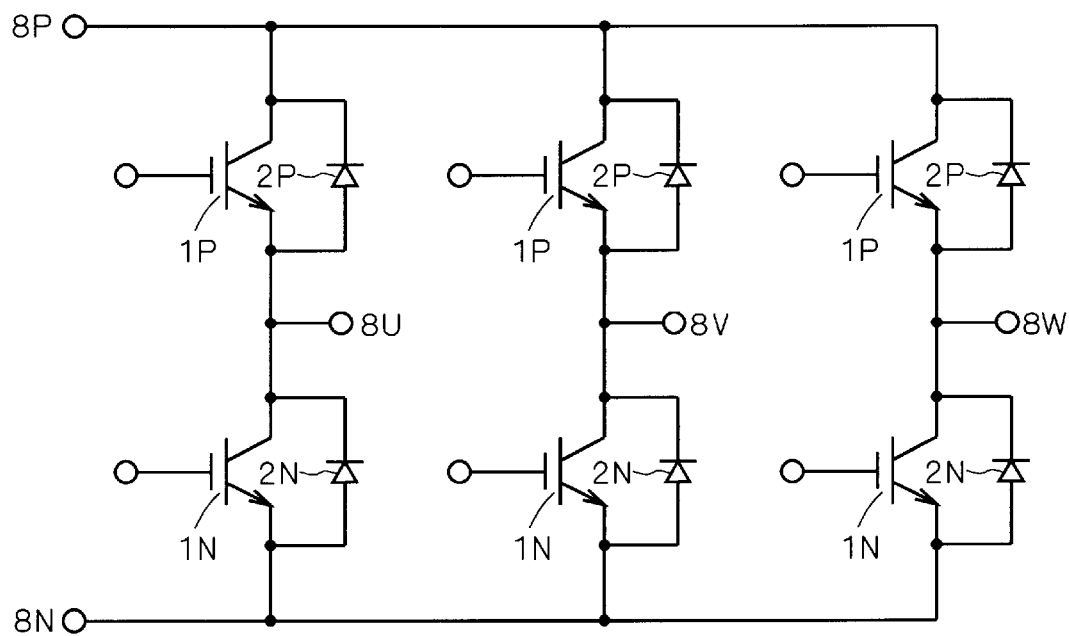

F/G. 27
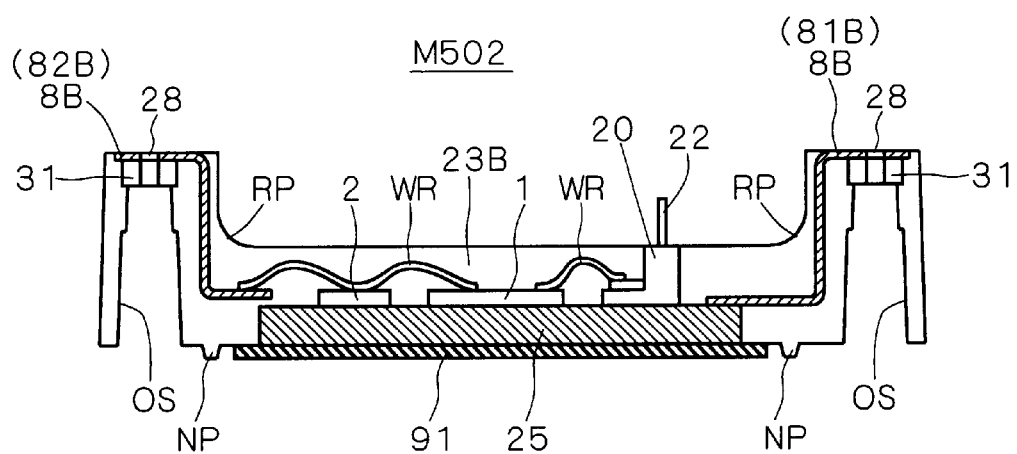
F/G. 28
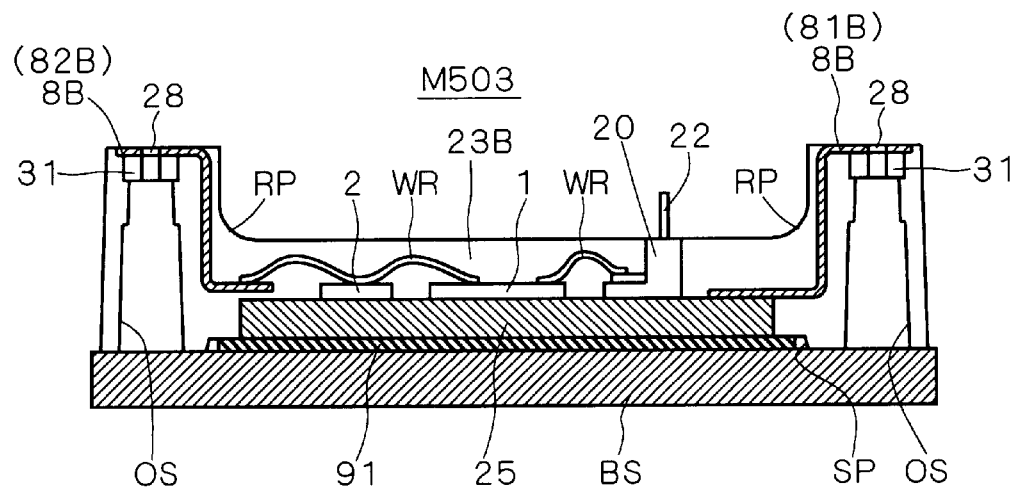

SEMICONDUCTOR DEVICE

BACKGROUND OF THE INVENTION

1. Field of the Invention

The present invention relates to a semiconductor device, in particular, to a semiconductor device for power which withstands a high voltage.

2. Description of the Background Art

FIG. 29 shows a cross section view of the structure of the semiconductor device M70 as an example of a conventional semiconductor device. As shown in FIG. 29, in the semiconductor device M70, for example, an insulating substrate 102 is mounted on a base plate 104 formed of oxygen-free copper and a semiconductor element 101, which is a switching element, is mounted on this insulating substrate 102. On the insulating substrate 102, a predetermined conductor pattern is provided on one of the main surfaces of the insulating substrate and a semiconductor element, or the like, is provided on this conductor pattern. In addition, a conductor layer is provided on the other main surface so as to provide a structure that can be adhered to a conductor plate, or the like, by means of soldering, or the like.

A resin case 105 which is formed of, for example, PPS (polyphenylene sulphide) is provided so as to surround the peripheral parts of the base plate 104.

The resin case 105 is provided with an electrode plate DE which is formed of an external connection electrode plate 108, a connection conductor 106 and an internal connection electrode 107 so as to be partially buried. The internal connection electrode 107 is electrically connected to the semiconductor element 101 or to the conductor pattern of the insulating substrate 102 through an aluminum wire 109 of the diameter of 200 $\mu$m to 300 $\mu$m.

Then, the internal space defined by the base plate 104 and the resin case 105 is filled in with, for example, silicone gel 110 in order to secure the insulation and a lid 111 is provided over the opening of the resin case 105 in order to block the silicone gel 110 from the air outside.

In addition, part of the main surface of the external connection electrode plate 108 is exposed on the main surface of the resin case 105 and a through hole is created in such part for the connection with an external conductor (not shown) while a nut 112 is buried in the resin case 105 in the place which corresponds to this through hole. Accordingly, the external connection electrode plate 108 and the external conductor can be connected by using a bolt (not shown) so that the contact resistance can be made small by fastening the bolt.

In this manner, a configuration wherein the semiconductor element 101 is contained in the resin case 105 is adopted in the semiconductor device M70 and, therefore, the manufacturing process becomes complicated, the dimensions of the external form become large and miniaturization or cost reduction are limited.

In addition, FIG. 30 shows a cross section view of the configuration of the semiconductor device M80 as an example of a conventional semiconductor device.

As shown in FIG. 30, in the semiconductor device M80, a semiconductor element 201 which is a switching element is mounted on a frame 213 which is formed of, for example, a copper alloy and the semiconductor element 201 is electrically connected to the lead 207 through an aluminum wire 209.

The semiconductor element 201, the lead 207 and the frame 213 are sealed in a mold resin 214 by using a transfer molding so as to be integrated. Then, a part of the lead 207 and a part of a lead 215 which extends from the frame 213 protrude to the outside from the mold resin 214 so as to be soldered to, for example, a printed circuit board which has through holes.

In this manner, though in the semiconductor device M80, the semiconductor element 201 is sealed in a resin by using transfer molding so that the number of parts is small and the cost can be held low, the heat emitted by the semiconductor element 201 at the time of the operation is radiated through the mold resin 214 of which the heat conductance is several Wm·K with a high heat resistance so as to have a problem radiating heat.

In addition, the lead 207 is thin and the cross section area of the lead 207 and the cross section area of the circuit pattern on the printed circuit board for allowing a heavy current to flow to which the lead 207 is connected cannot be sufficiently secured and, therefore, the loss due to the electrical resistance cannot be ignored and there is the problem that the lead is not suitable for a semiconductor device for a heavy current.

In addition, FIG. 31 shows a cross section view of the configuration of the semiconductor device M90 as an example of a conventional semiconductor device.

As shown in FIG. 31, in the semiconductor device M90, a semiconductor element 301 which is a switching element is mounted on an insulating substrate 302 and the semiconductor element 301 is electrically connected to a lead 315 through an aluminum wire 309. Then, the insulating substrate 302, the semiconductor element 301 and the lead 315 are sealed in a mold resin 314 by using transfer molding so as to be integrated.

A main surface of the insulating substrate 302 opposite to the main surface, on which the semiconductor element 301 is mounted, is exposed from the mold resin 314 and is soldered to a metal substrate 304. In addition, a control circuit substrate 317 or a relay substrate 318 are also provided on the metal substrate 304.

The control circuit substrate 317 is a substrate on which a control circuit, or the like, for controlling the operation of the semiconductor element 301 is provided and the relay substrate 318 is a substrate to which a relay point of the lead 315 is provided.

The leads 315 which extend from mold resin 314 are connected to the relay substrate 318 and a conductor layer 319 which is provided on the control circuit substrate 317 and the lead 315 which is connected to the relay substrate 318 is electrically connected to the external connection electrode plate 316 via the conductive layer 319 and the lead 315 connected to the control circuit substrate 317 is connected to a control terminal 320 via the conductive layer 319.

In this manner, in the semiconductor device M90, the insulating substrate 302, on which the semiconductor element 301 is mounted, contacts the metal substrate 304 and, therefore, the semiconductor device M90 is superior to the semiconductor device M80 concerning the radiation of heat. However, the control circuit substrate 317 and the relay substrate 318 are separately provided on the metal substrate 304 and, therefore, layout efficiency is poor and there is the problem that miniaturization is difficult.

In addition, the area of the loop circuit, which is formed starting from and reaching to the external connection electrode plate 316 via the relay substrate 318, the lead 315, one of the main electrodes of the semiconductor element 301, the other main electrode, the relay substrate 318 and the lead 315, becomes large so as to have a large inductance and this becomes a factor leading to the occurrence of a large surge voltage. Therefore, the change ratio of the current becomes large in the case that the semiconductor element 301 is operated in a switching manner and, therefore, an element which withstands a high voltage must be prepared and this becomes a factor leading to an increase in the cost.

As described above, in a conventional semiconductor device, it is difficult to satisfy both the requirements concerning the radiation of heat and concerning miniaturization.

SUMMARY OF THE INVENTION

According to the first aspect of the present invention, a semiconductor device comprises a radiation substrate, semiconductor elements provided on the radiation substrate, a plurality of main electrode plates of which one end is electrically connected to a main electrode of the semiconductor elements, respectively and a resin package for sealing the radiation substrate, the semiconductor elements and the plurality of main electrode plates in a resin, wherein the other end of each of the plurality of main electrode plates is exposed to the outside of the upper surface of the resin package and wherein the resin package is integrally formed by means of molding.

According to the second aspect of the present invention, in the semiconductor device, the resin package is in a box shape and a main surface of the other end of each of the plurality of main electrode plates alone is exposed on the upper surface of the resin package.

According to the third aspect of the present invention, in the semiconductor device, the exposure position of the main surface of the other end of each of the plurality of main electrode plates is a position near a center of the upper surface of the resign package.

According to the fourth aspect of the present invention, in the semiconductor device, the resin package has a body part in a box shape and a plurality of protruding electrode parts which, respectively, protrude from the upper surface of the body part and contain the plurality of main electrode plates within the inside and the main surface of the other end of each of the plurality of main electrode plates alone is exposed on the upper surface of each of the plurality of protruding electrode parts.

According to the fifth aspect of the present invention, in the semiconductor device, the plurality of protruding electrode parts are formed so that the bordering parts between the plurality of protruding electrode parts and the body part have curved surfaces.

According to the sixth aspect of the present invention, in the semiconductor device, the plurality of protruding electrode parts are provided at peripheral parts of the body part and have cavities inside thereof; and the other end of each of the plurality of main electrode plates is provided so as to cover the upper of each of the cavities.

According to the seventh aspect of the present invention, in the semiconductor device, the other end of each of the plurality of main electrode plates has a through hole and the through hole has a thread around the inner surface thereof.

According to the eighth aspect of the present invention, in the semiconductor device, the through hole is created by means of a burring process and the thread is provided on a burring part which protrudes to the side of the cavity by means of the burring process.

According to the ninth aspect of the present invention, in the semiconductor device, the other end of each of the plurality of main electrode plates has a through hole and the plurality of protruding electrode parts further have nuts buried therein so that the thread of each of the nuts are connected to that of the through hole.

According to the tenth aspect of the present invention, in the semiconductor device, the semiconductor device further comprises a control circuit which is provided on the radiation substrate and which carries out a driving control of the semiconductor elements.

According to the eleventh aspect of the present invention, in the semiconductor device, the control circuit is covered with a resin of which the viscosity is smaller than that of the mold resin of the resin package.

According to the twelfth aspect of the present invention, in the semiconductor device, a bottom surface of the radiation substrate, that is the opposite side of the surface on which the semiconductor elements are mounted, is exposed from the bottom surface of the resin package and the semiconductor device further comprises an insulating layer provided on the side of the bottom surface of the resin package so as to, at least, completely cover the bottom surface of the radiation substrate.

According to the thirteenth aspect of the present invention, in the semiconductor device, the insulating layer is formed of an insulating material in a sheet form attached to the bottom surface of the resin package.

According to the fourteenth aspect of the present invention, in the semiconductor device, the bottom surface of the resin package has a step region which is recessed and corresponds to the exposure region of the bottom surface of the radiation substrate and the depth of the step region is lower than the thickness of the insulating layer.

According to the fifteenth aspect of the present invention, in the semiconductor device, the bottom surface of the resin package has a plurality of protruding parts which are provided so as to surround the exposure region of the bottom surface of the radiation substrate and the height of the protruding parts is lower than the thickness of the insulating layer.

According to the sixteenth aspect of the present invention, the semiconductor device further comprises a radiation plate which closely contacts on the insulating layer and of which the area is broader than that of the insulating layer.

According to the seventeenth aspect of the present invention, a semiconductor device comprises a plurality of radiation substrates, semiconductor elements respectively provided on the plurality of radiation substrates, a plurality of main electrode plates of which one end is electrically connected to a main electrode of each of the semiconductor elements, respectively, and a resin package for sealing the plurality of radiation substrates, the semiconductor elements and the plurality of main electrode plates in a resin, wherein the other end of each of the plurality of main electrode plates is exposed to the outside of the upper surface of the resin package and wherein the resin package is integrally formed by means of molding.

According to the eighteenth aspect of the invention, in the semiconductor device, all of the plurality of radiation substrates have a same rectangular shape and are arranged so that the long sides thereof are parallel to each other.

In accordance with a semiconductor device according to the first aspect of the present invention, the other end of each of the plurality of main electrode plates is exposed to the outside of the upper surface of the resin package and the resin package is integrally formed by means of molding and, therefore, the components can be effectively arranged and the dimension of the external form of the radiation substrate can be made approximately as large as the dimension of the external form of the resin package so that the miniaturization becomes possible while maintaining the radiation performance. In addition, since the plurality of the main electrode plates are provided so as to be exposed on the upper surface of resin package and, therefore, the area of the loop circuit formed of the plurality of the main electrode plates and an electric path that electrically connects these electrodes becomes small so that the inductance of the loop circuit can be made small.

In accordance with a semiconductor device according to the second aspect of the present invention, the resin package is in a box shape and the main surface of the other end of each of the plurality of main electrode plates alone is exposed on the upper surface of the resin package and, therefore, the package has a simple shape of which the structure is physically strong.

In accordance with a semiconductor device according to the third aspect of the present invention, the exposure position of the main surface of the other end of each of the plurality of main electrode plates is a position at a distance away from an edge on the upper surface of the resign package and, therefore, in the case that the resin package is attached to a heat sink, the distance for isolation from the heat sink to the main electrode plates can be easily secured so that a semiconductor device which can withstand a high voltage, even though the thickness of the resin package thereof is small, can be gained.

In accordance with a semiconductor device according to the fourth aspect of the present invention, the resin package has a body part in a box shape and a plurality of protruding electrode parts which, respectively, protrude from the upper surface of the body part and, therefore, in the case that the resin package is attached to a heat sink, the distance for isolation from the heat sink to the main electrode plates can be more easily secured so that a semiconductor device which can withstand a high voltage, even though the thickness of the body part thereof is small, can be gained. Then because of the existence of the protruding electrode parts, the thickness of the body part, wherein the radiation substrate is buried, can be set at the minimum and, therefore, even in the case that a temperature change occurs due to the heat emission at the time when the device is employed, a warp can be prevented from occurring over the entire resin package and the radiation from the semiconductor device to the heat sink can be prevented from lowering in the efficiency so that the temperature of the semiconductor device can be prevented from increasing to the allowable limit or higher.

In accordance with a semiconductor device according to the fifth aspect of the present invention, the plurality of protruding electrode parts are formed so that the bordering parts vis-à-vis the body part have curved surfaces and, therefore, in the case that, for example, a main electrode plate and an exterior conductor are fastened with a bolt in a protruding electrode part, even though the bolt is squeezed with a large torque, the stress caused in the border part between the body part and the protruding electrode part becomes small so that the protruding electrode part can withstand the squeeze pressure of the bolt, even though the dimension of the protruding electrode part is small, so as to be able to achieve the miniaturization of the semiconductor device.

In accordance with a semiconductor device according to the sixth aspect of the present invention, the plurality of protruding electrode parts have cavities inside thereof and, therefore, it becomes possible to provide nuts in the cavities so that a main electrode plate and an exterior conductor are tightened with a bolt and, thereby, the exterior conductor and the main electrode plate can be connected through a small contact resistance.

In accordance with a semiconductor device according to the seventh aspect of the present invention, the other end of each of the plurality of main electrode plates has a through hole and the through hole has a thread around the inner surface thereof and, therefore, at the time when a main electrode plate and an exterior conductor are fastened with a bolt, it is not necessary to prepare a nut, increasing the ease of assembly.

In accordance with a semiconductor device according to the eighth aspect of the present invention, the through hole is created by means of a burring process and the thread is provided on a burring part and, therefore, a thread can be formed even when the thickness of the main electrode plate is small.

In accordance with a semiconductor device according to the ninth aspect of the present invention, the plurality of protruding electrode parts have nuts buried therein so that the thread of each of the nuts are connected to that of the through hole and, therefore, at the time when a main electrode plate and an exterior conductor are fastened with a bolt, it is not necessary to prepare a nut, increasing the ease of assembly.

In accordance with a semiconductor device according to the tenth aspect of the present invention, the semiconductor device comprises a control circuit which is provided on the radiation substrate and which carries out a driving control of the semiconductor elements and, therefore, the control circuit is provided in the vicinity of the semiconductor elements so that the area of a control wire loop formed between the control circuit and the semiconductor elements can be made small in comparison with the case where the control circuit is provided outside of the semiconductor device and even in the case that a large amount of electromagnetic noise occurs, for example, in a switching element for a heavy current, a voltage fluctuation can be prevented from occurring in the control signal.

In accordance with a semiconductor device according to the eleventh aspect of the present invention, the control circuit is covered with a resin of which the viscosity is smaller than that of the mold resin of the resin package and, therefore, even a control circuit under the condition of a semiconductor chip which is not packaged can be protected from the pressure of the mold resin at the time of the formation of the resin package.

In accordance with a semiconductor device according to the twelfth aspect of the present invention, the bottom surface of the radiation substrate is exposed from the bottom surface of the resin package and an insulating layer is provided so as to, at least, completely cover the bottom surface of the radiation substrate and, therefore, no void occurs within the mold resin, which may possibly occur in a structure where the radiation substrate is buried in the resin package, thus enhancing productivity.

In accordance with a semiconductor device according to the thirteenth aspect of the present invention, the insulating layer is formed of an insulating material in a sheet form that is attached to the bottom surface of the resin package and, therefore, the formation is simple and the thickness thereof can be made even.

In accordance with a semiconductor device according to the fourteenth aspect of the present invention, the bottom surface of the resin package has a step region which is recessed and corresponds to the exposure region of the bottom surface of the radiation substrate and the depth of the step region is lower than the thickness of the insulating layer and, therefore, for example, at the time when the semiconductor device is attached to a heat sink, they are fastened with a bolt, or the like, until the resin package around the step region completely touches the heat sink and, thereby, the insulating layer is compressed so that the thickness thereof becomes equal to the depth of the step region. Accordingly, the depth of the step region is set at a value equal to the minimum thickness of the insulating layer for securing the insulation and the bolt is fastened until the resin package completely touches the heat sink and, thereby, the insulating layer can be prevented from becoming thinner than the minimum thickness due to unevenness of fastening and, in addition, it becomes unnecessary to include an additional margin to the thickness of the insulating layer and, thus, the radiation can be increased.

In accordance with a semiconductor device according to the fifteenth aspect of the present invention, the bottom surface of the resin package has a plurality of protruding parts which are provided so as to surround the exposure region of the bottom surface of the radiation substrate and the height of the protruding parts is lower than the thickness of the insulating layer and, therefore, for example, at the time when the semiconductor device is attached to a heat sink, they are fastened with a bolt, or the like, until the protruding parts completely touches the heat sink and, thereby, the insulating layer is compressed so that the thickness thereof can be made equal to the height of the protruding parts, and as a result, the insulating layer can be prevented from becoming thinner than the minimum thickness due to the unevenness of the fastening and, in addition, it becomes unnecessary to include a margin of the thickness of the insulating layer more than necessary so as to be able to increase the radiation.

In accordance with a semiconductor device according to the sixteenth aspect of the present invention, the semiconductor device further comprises a radiation plate which closely contacts on the insulating layer and of which the area is broader than that of the insulating layer and, therefore, for example, at the time when the semiconductor device is attached to a heat sink, the contact area with the heat sink increases and the radiation can be increased.

In accordance with a semiconductor device according to the seventeenth aspect of the present invention, by making small the intervals between the plurality of radiation substrates, the area of the device can be made small in comparison with the case where a plurality of independent semiconductor devices are combined so that miniaturization, weight reduction and cost reduction can be achieved.

In accordance with a semiconductor device according to the eighteenth aspect of the invention, the area of a circuit loop formed of a main current path of a semiconductor element starting from a main electrode plate and reaching to a different main electrode plate via the semiconductor element and a radiation substrate as well as a main current path with respect to the semiconductor element provided on the adjacent radiation substrate can be made small so that the inductance of the loop circuit can be made small. As a result, the power loss in the semiconductor elements is reduced so that the amount of heat emitted in the semiconductor device can be made small.

The present invention is provided in order to solve the above described problems and the purpose of the invention is to provide a semiconductor device which satisfies both requirements for radiation and for miniaturization while having a semiconductor element for a heavy current.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view showing the configuration of a semiconductor device according to a first preferred embodiment of the present invention;

FIG. 2 is a cross section view showing the configuration of the semiconductor device according to the first preferred embodiment of the present invention;

FIG. 11 is a cross section view showing the configuration of a modified example 2 of the semiconductor device according to the second preferred embodiment of the present invention;

FIG. 12 is a schematic view showing a manufacturing process of the modified example 2 of the semiconductor device according to the second preferred embodiment of the present invention;

FIG. 18 is an equivalent circuit diagram of the semiconductor device according to the third preferred embodiment of the present invention;

FIG. 27 is a cross section view showing the configuration of a modified example 2 of the semiconductor device according to the fifth preferred embodiment of the present invention;

FIG. 28 is a cross section view showing the configuration of a modified example 3 of the semiconductor device according to the fifth preferred embodiment of the present invention.

DESCRIPTION OF THE PREFERRED EMBODIMENTS

Figure 3:
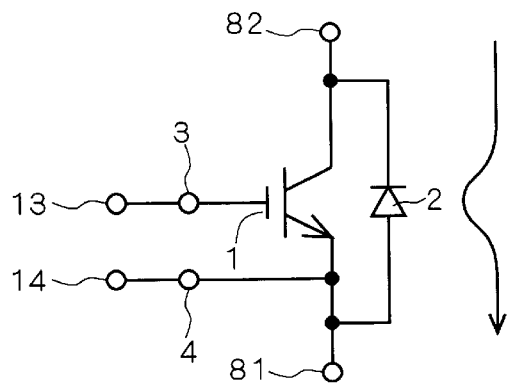
FIG. 3 is an equivalent circuit diagram of the semiconductor device according to the first preferred embodiment of the present invention.

<A. First Preferred Embodiment>
<A-1. Device Configuration>

FIG. 1 shows a perspective view of the configuration of the semiconductor device M100 as the first preferred embodiment according to the present invention. Here, in FIG. 1, part of a resin package 23 is omitted for the purpose of convenience so as to clearly show the internal configuration.

As shown in FIG. 1, the semiconductor device M100 has an IGBT (insulating gate bipolar transistor) element 1 and a diode element 2 provided on the main surface of a heat spreader 25 (radiation substrate) in an elongate form which is formed of a metal with excellent heat conductivity and electricity conductivity and the entire structure thereof is buried in the resin package 23.

On the main surface of the heat spreader 25 a relay terminal block 20 is provided outside of the IGBT element 1 and the relay terminal block 20, the IGBT element 1 and the diode element 2 are aligned. Then, external connection electrode plates 81 and 82 are respectively provided on both sides of this alignment. There is a case when the external connection electrode plates 81 and 82 are referred to by the general term of external connection electrode plate 8 (main electrode plate).

A plurality of aluminum wires WR make electric connections between the IGBT element 1 and the diode element 2, between the IGBT element 1 and the relay terminal block 20 as well as between the diode element 2 and the external connection electrode plate 82. Here, the main electrode is exposed on the respective lower main surfaces of the IGBT element 1 and the diode element 2 so as to be soldered to the heat spreader 25.

The relay terminal block 20 is provided with a relay terminal plate group 21 to which a plurality of aluminum wires WR, which are electrically connected to the IGBT element 1, are connected and a relay pin terminal group 22 which inputs and outputs control signals for controlling the IGBT element 1 to and from an external apparatus where the relay pin terminal group 22 extends vertically to the main surface of the heat spreader 25.

Here, the relay terminal plate group 21 includes a gate relay terminal plate 3 and a control emitter relay terminal plate 4 which are electrically connected to the gate and the emitter of the IGBT element 1, respectively, while the relay pin terminal group 22 includes a gate relay pin 13 and a control emitter relay pin 14 which are provided so as to respectively correspond to the gate relay terminal plate 3 and the control emitter relay terminal plate 4.

The external connection electrode plate 81 is provided so that one end thereof is connected to the main surface of the heat spreader 25 while the main surface of the other end is exposed on the upper surface of the resin package 23.

The external connection electrode plate 82 has a similar shape to the external connection electrode plate 81 and is not electrically connected to the heat spreader 25 so that the end part thereof is located above the main surface of the head spreader 25. Here, a through hole is created in the part which is exposed from the resin package 23 of the external connection electrode plate 8 for the condition with a bus bar wire (not shown).

The heat spreader 25, the IGBT element 1, the diode element 2, the relay terminal block 20 and the external connection electrode plate 8 in the above are sealed in a resin of a box shape by using transfer molding so that the resin package 23 defines the external form of the semiconductor device M100.

Here, through holes 24 are created in the four corners of the resin package 23 for securing the semiconductor device M100 to a heat sink or the like which is not shown.

FIG. 2 shows a cross section view along the longitudinal direction of the configuration of the semiconductor device M100. As shown in FIG. 2, the heat spreader 25 is completely buried in the resin package 23.

Here, FIG. 3 shows connection relationships of the IGBT element 1 and the diode element 2. As shown in FIG. 3, the diode element 2 is connected parallel to the IGBT element 1 in the direction where the forward current returns so as to function as a free wheel diode.

Here, the emitter of the IGBT element 1 is connected to the external connection electrode plate 81 and is also connected to the control emitter relay pin 14 via the control emitter relay terminal plate 4.

In addition, the gate of the IGBT element 1 is connected to the gate relay pin 13 via the gate relay terminal plate 3.

The control emitter relay pin 14 is employed at the time of driving of the IGBT element 1 and the IGBT element 1 can be driven by applying a voltage between the gate and the emitter (for example, approximately 15 V), that is, between the control emitter relay pin 14 and the gate relay pin 13.

Here, the control emitter relay pin 14 and the gate relay pin 13 are connected to a control circuit, a driving circuit and the like which are not shown.

Here, the IGBT element 1 has a current sensing electrode which is formed so as to allow a current (sensing current) that is one several thousandth of the current flowing through the emitter and that is included a relay pin for outputting the sensing current which is electrically connected to this current sensing electrode and the relay pin terminal group 22 for temperature detection, of which the descriptions are omitted.

<A-2. Manufacturing Process>

Next, a process for the semiconductor device M100 is described in reference to FIGS. 1 and 2.

First, the IGBT element 1, the diode element 2, the relay terminal block 20 and the external connection electrode plate 81 are soldered and connected to the heat spreader 25. At this time, aluminum wires WR are wire bonded to respective components so as to connect them to each other.

The external connection electrode plate 81 is formed so as to be integrated into a lead frame (not shown) surrounding the heat spreader 25 and the lead frame and the heat spreader 25 are integrated by connecting the external connection electrode plate 81 to the heat spreader 25. Here, though the external connection electrode plate 82 is also formed so as to be integrated to the lead frame, this is not connected to the heat spreader 25.

The lead frame is placed in a molding die for transfer molding under the above condition and by making a melt resin flow into the molding die the resin molding is completed. After this, the molding die is removed and the external connection electrode plates 81 and 82 are separated from the lead frame and thereby the semiconductor device M100 which is covered with the resin package 23 can be gained.

<A-3. Working Effects>

As described above, in the semiconductor device M100 according to the present invention, the IGBT element 1, the diode element 2, the relay terminal block 20, the external connection electrode plate 8 and the heat spreader 25 are integrally sealed in a resin by means of transfer molding and, therefore, the layout efficiency is excellent and the dimension of the external form of the heat spreader 25 can be made approximately as large as the dimension of the external form of the resin package 23 so that the miniaturization becomes possible while maintaining the radiation performance.

In addition, the external connection electrode plate 8 is provided so that the connection part with an external conductor is exposed on the upper surface of the resin package 23 and, therefore, the area of the loop circuit formed of the two external connection electrode plates 8 and two main electrodes of the IGBT element 1 and a current path or electrically connecting these becomes small so that the inductance of this loop circuit can be made small.

The peak voltage of the surge voltage which occurs together with a current change at the time when the switching element is operated in a switching manner becomes smaller in proportion to the inductance and, as a result, the switching loss becomes small. Therefore, the heat emitted by the IGBT element 1 becomes small and the operational range becomes broad concerning heat design even when the area of the heat spreader 25 is made smaller. Accordingly, miniaturization of the entire device can be achieved and the surge voltage is lowered so that the withstand voltage can be lowered and the cost of the device becomes inexpensive.

In addition, since the connection part of the external connection electrode plate 8 for connection with an external conductor is provided on the upper surface of the resin package 23, the insulating distance from the heat sink to the external connection electrode plate 8 is easily secured so that a semiconductor device of which the withstand voltage characteristics are excellent can be gained. These characteristics are described in reference to FIG. 4.

Figure 4:
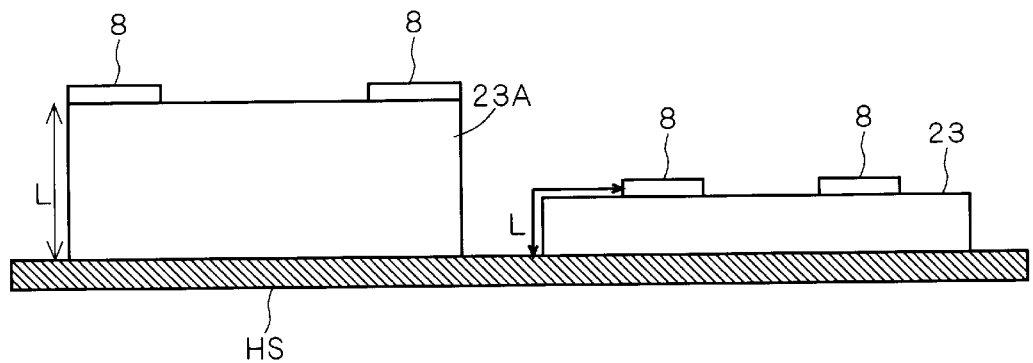
FIG. 4 is a schematic diagram for describing the effect gained by the first preferred embodiment of the present invention.

FIG. 4 is a diagram schematically showing a change in the thickness of the mold resin according to the installation position of the external connection electrode plate 8.

In FIG. 4, the external connection electrode plate 8 is provided in the vicinity of the peripheral part of the upper surface of the resin package 23A in the left semiconductor device so that the insulating distance L from the heat sink HS to the external connection electrode plate 8 is defined by the thickness of the resin package 23A.

On the other hand, the external connection electrode plate 8 is provided in the position closer to the central part on the upper surface of the resin package 23 in the right semiconductor device so that the insulating distance L from the heat sink HS to the external connection electrode plate 8 is defined by the thickness of the resin package 23 and by the distance from the peripheral part on the upper surface of the resin package 23 to the external connection electrode plate 8.

In this manner, by arranging the connection part of the external connection electrode plate 8 for connection with an external conductor on the upper surface of the resin package 23, the insulating distance L from the heat sink HS to the external connection electrode plate 8 becomes easily secured and, therefore, a semiconductor device that can withstand a high voltage can be gained even in the case that the thickness of the resin package 23 is small.

Then, in the case that the thickness of the resin package 23 can be made thinner, warping of the resin package 23 due to heat emission at the time of device utilization can be prevented.

That is to say, there is a large difference in the linear expansion ratio between the mold resin and the heat spreader 25 due to difference of materials. Accordingly, when a temperature change occurs due to heat emission at the time of device utilization, warping of the entire resin package 23 occurs. Then, in the case that the amount of this warping exceeds, for example, several hundreds of $\mu$m, a gap is created between the resin package 23 and the heat sink (not shown) to which the resin package 23 is secured so that the heat emission from the semiconductor device to the heat sink is blocked and there is a possibility that the temperature of the semiconductor device will become of the allowable value or higher.

However, when the thickness of the resin package 23 is thin in comparison with the thickness of the heat spreader 25 warping is small even in the case that the same amount of temperature change occurs. As a result, the heat resistance can be maintained at a small value at the part contacting the heat sink so that the radiation performance can be maintained.

In addition, since the radiation performance can be maintained, the increase in temperature of the semiconductor device can be limited and, therefore, a greater selection of materials for the mold resin can be used and, therefore, less expensive mold resin can be utilized so as to reduce the cost.

In this manner, by placing the contact part of the external connection electrode plate 8 for connection with an external conductor at a distance away from an edge on the upper surface of the resin package 23, a sufficient insulating distance can be secured even in the case that the resin package 23 is thin and a withstand voltage of several hundred volts or more can be gained even for a semiconductor device through which a heavy current flows such that a temperature change of several tens of ° C. occurs.

Here, it is desirable for the linear expansion ratio of the mold resin to be close to the linear expansion ratio of the heat spreader 25 in order to limit warping of the resin package 23 and, for example, in the case that the heat spreader 25 is formed of copper (Cu), it is desirable for the linear expansion ratio of the mold resin to be approximately $16 \times 10^{-6}$/K.

Here, though the configuration of the above described semiconductor device M100 has one IGBT element 1 and one diode element 2, the configuration may, of course, have a plurality of the same number of IGBT elements 1 and diode elements 2 or a plurality of semiconductor devices M100 can be collected in a plural number so as to form a unit by electrically connecting them in parallel and can be formed to be equivalent to one semiconductor device having a plurality of IGBT elements connected in parallel. Accordingly, a semiconductor device which corresponds to any amount of current capacitance can be easily gained.

In addition, the semiconductor devices M100 can be used by arbitrarily being combined according to an application such that in the case of the utilization for an inverter of a three phase motor, six of the semiconductor devices M100 are used and, therefore, productivity can be enhanced without increasing the types of products.

Figure 5:
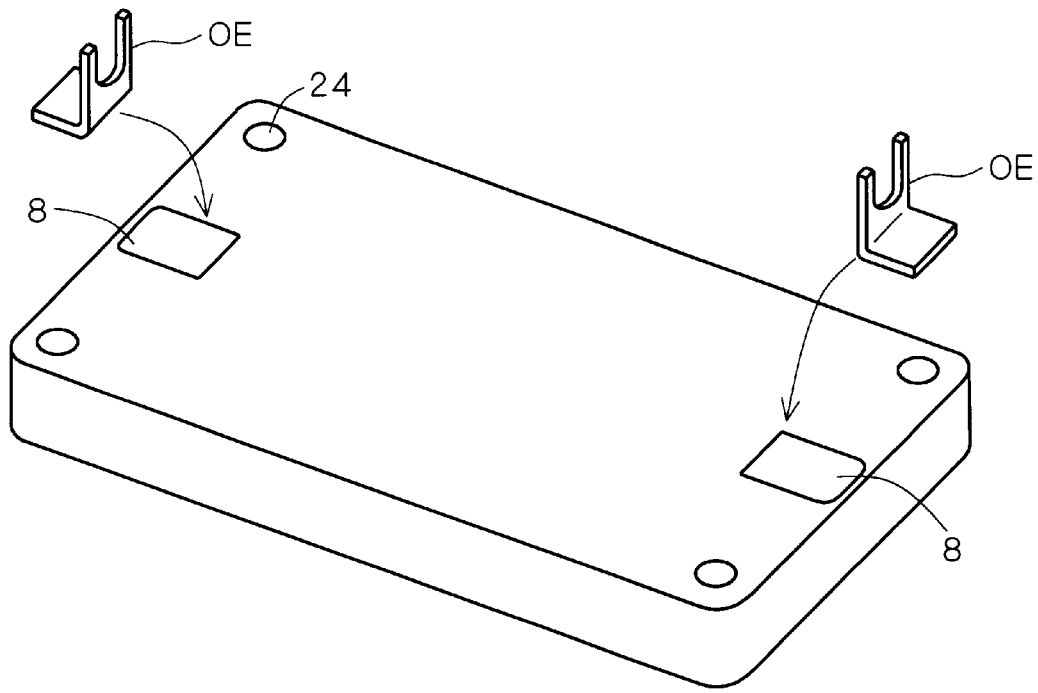
FIG. 5 is a perspective view showing a utilization form of the semiconductor device according to the first preferred embodiment of the present invention.

Here, the two external connection electrode plates 8 are provided on the upper surface of the resin package 23 so that the connection parts for connection with an external conductor are exposed and an external conductor attachment electrode OE as shown in FIG. 5 is connected by means of screws for connection with an external conductor so that connection with a variety of external conductors becomes possible and multipurpose utilization becomes possible.

<A-4. Modified Example>

Figure 6:
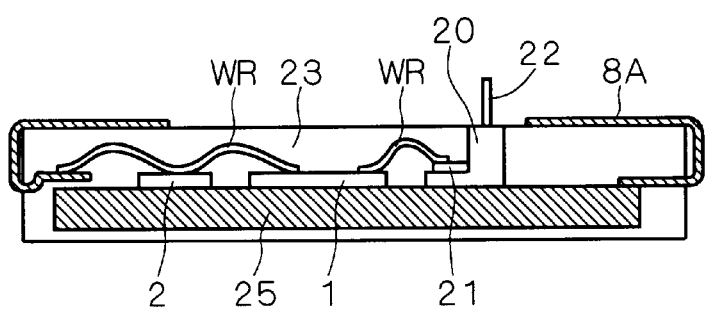
FIG. 6 is a cross section view showing the configuration of a modified example of the semiconductor device according to the first preferred embodiment of the present invention.

Though, in the above described semiconductor device M100, the configuration is shown wherein two external connection electrode plates 8 are completely buried in the mold resin and the connection parts for connection with an external conductor are exposed on the upper surface of the resin package 23, a configuration such as of the semiconductor device M101 shown in FIG. 6 is possible.

That is to say, two external connection electrode plates 8A have shapes that protrude out through the sides of the resin package 23 from approximately the middle of the resin package 23 in the direction of the thickness of the resin package 23, more concretely, from the positions corresponding to the upper main surface of the heat spreader 25 and are bent to follow the sides of the resin package 23 and are bent again at the position where they reach to the upper surface of the resin package 23 to follow the upper surface.

In this manner, by making the two external connection electrode plates 8A protrude through the sides of the resin package 23, it becomes unnecessary to bury external connection electrode plates of a complicated shape in the resin package 23 so that there is the advantage that it is not necessary to prepare a molding die of a complicated structure at the time of transfer molding.

As a result of this, the design of the molding die and the manufacturing process becomes easier so that cost can be reduced, restrictions concerning production facilities are reduced and productivity can be enhanced.

In addition, since the two external connection electrode plates 8A have parts which extend parallel to the heat spreader 25 and parts which extend parallel to the upper surface of the resin package 23, the inductance which occurs at the time of the switching on of the power can be cancelled in those two parts so that the inductance which occurs at the external connection electrode plates 8A at the time of the switching on of the power can be reduced.

Then, the switching loss becomes smaller due to the reduction of the inductance and the heat emitted by the IGBT element 1 is reduced and, as a result, the entire device can be miniaturized as described above.

Here, the minimum distance between the heat sink (not shown) to which the semiconductor device M101 is attached and the external connection electrode plates 8A is determined at a value which does not cause creeping discharge for the power voltage of the semiconductor device M101 from the viewpoint that the insulating withstand voltage is secured at the time of the utilization of the semiconductor device M101.

<B. Second Preferred Embodiment>
<B-1. Device Configuration>

Figure 7:
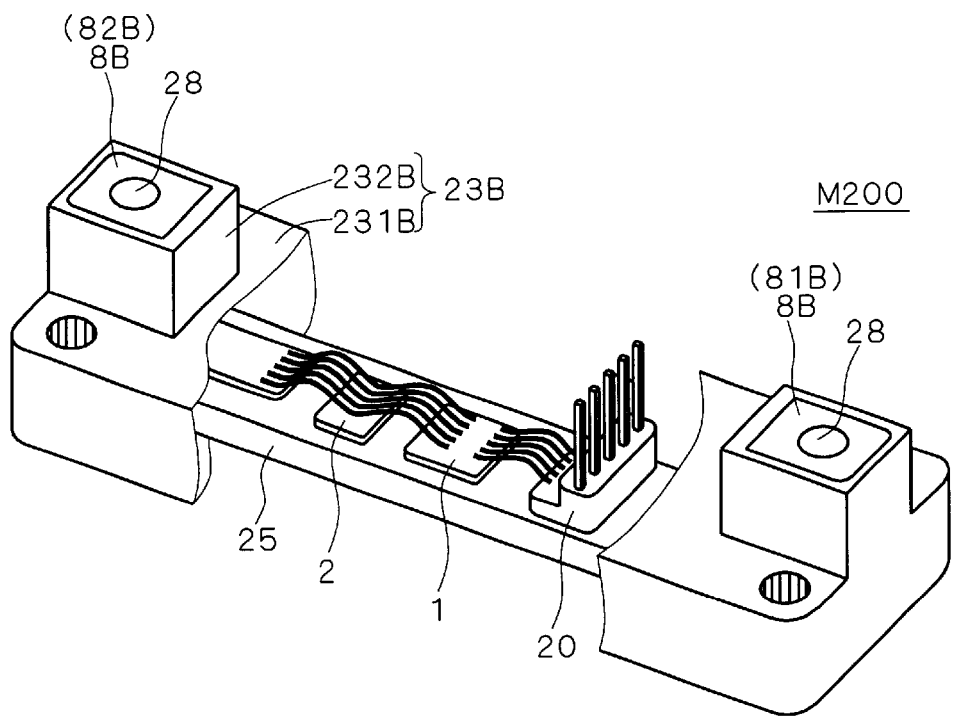
FIG. 7 is a perspective view showing the configuration of a semiconductor device according to a second preferred embodiment of the present invention.

FIG. 7 shows a perspective view of the configuration of the semiconductor device M200 as the second preferred embodiment according to the present invention. Here, in FIG. 7, part of a resin package 23B is omitted for the purpose of convenience so as to clearly show the internal configuration.

As shown in FIG. 7, the internal configuration of the semiconductor device M200 is essentially the same as that of the semiconductor device M100 which is described in reference to FIG. 1 and the same symbols are attached to the same components and repetitive descriptions are omitted.

In the semiconductor device M200 the resin package 23B is not in a simple box shape as is the resin package 23 shown in FIG. 1 and is in a shape that has two electrode protruding parts 232B on the upper surface of the body part 231B which corresponds to the resin package 23.

The electrode protruding parts 232B are in a rectangular parallelepiped form and internally contain external connection electrode plates 8B which extend from the body part 231B.

Though the external connection electrode plates 8B have essentially the same shape as that of the external connection electrode plates 8 in the semiconductor device M100, they extend further in the height direction than the external connection electrode plates 8. Here, among the two external connection electrode plates 8B, the one connected to the heat spreader 25 is referred to as external connection electrode plate 81B and the one electrically connected to the diode element 2 is referred to as external connection electrode plate 82B.

Figure 8:
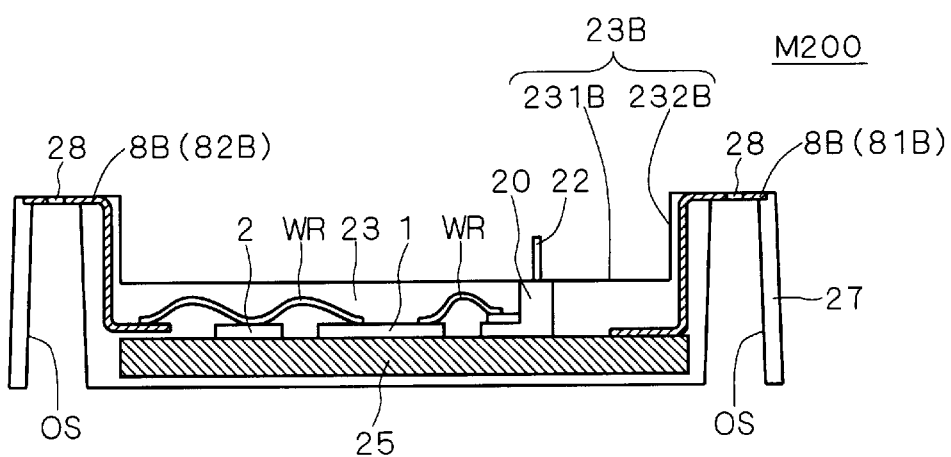
FIG. 8 is a cross section view showing the configuration of the semiconductor device according to the second preferred embodiment of the present invention.

FIG. 8 shows a cross section view along the longitudinal direction of the structure of the semiconductor device M200. As shown in FIG. 8, one end of the external connection electrode plate 81B is connected to the main surface of the heat spreader 25 while the main surface of the other end is provided so as to be exposed on the upper surface of the electrode protruding part 232B.

Though the external connection electrode plate 82B has the same shape as the external connection electrode plate 81B, it is not electrically connected to the heat spreader 25 and the peripheral part thereof is located above the main surface of the heat spreader 25.

In addition, the insides of the electrode protruding parts 232B form cavities OS so as to provide a configuration where the external connection electrode plates 8B cover the upper openings of the cavities OS. Then, through holes 28 are created in the exposed parts of the external connection electrode plates 8B.

<B-2. Manufacturing Process>

Figure 9:
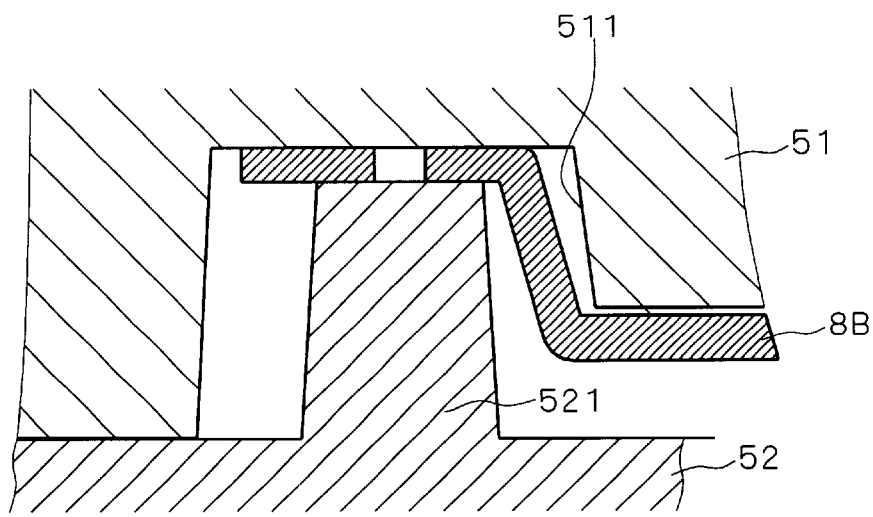
FIG. 9 is a cross section view showing a manufacturing process of the semiconductor device according to the second preferred embodiment of the present invention.

Here, a process for forming the electrode protruding parts 232B is described in reference to FIG. 9. The resin package 23B is formed by means of transfer molding and, therefore, as shown in FIG. 9, an upper molding die 51 wherein a recess 511 is created so as to agree with the exterior form of the electrode protruding parts 232B in the part which corresponds to the electrode protruding parts 232B and a lower molding die 52 wherein a convex part 521 is provided so as to agree with the exterior form of the cavities OS.

Then, the lead frame to which the heat spreader 25 is connected is placed between the upper molding die 51 and the lower molding die 52 and a melt resin is made to flow into the molding dies so as to complete the resin sealing.

<B-3. Working Effects>

In this manner, by making the external connection electrode plates 8B protrude from the upper surface of the body part 231B of the resin package 23B, the distance between the heat sink (not shown) to which the semiconductor device M200 is attached and the exposed parts of the external connection electrode plates 8B, that is to say the insulating distance, can be sufficiently secured and, therefore, it becomes possible to set the withstand voltage at a higher value.

Then, because of the existence of the electrode protruding parts 232B, the thickness of the body part 231B in which the heat spreader 25 is buried can be set at the minimum and, therefore, even when a temperature change occurs due to the heat emission at the time of device utilization, warping of the entire resin package 23B can be prevented from occurring and the effects of heat radiation from the semiconductor device to the heat sink can be prevented from being lowered so that the temperature of the semiconductor device can be prevented from becoming of the allowable value or higher.

In addition, since the insides of the electrode protruding parts 232B are cavities OS, by providing external conductors (not shown) on the exposed parts of the external connection electrode plates 8B and by providing nuts (not shown) in the cavities OS, the external conductors and the external connection electrode plates 8B can be connected with a small contact resistance by fastening the exterior conductors with bolts (not shown) and the nuts.

<B-4. Modified Example 1>

Figure 10:
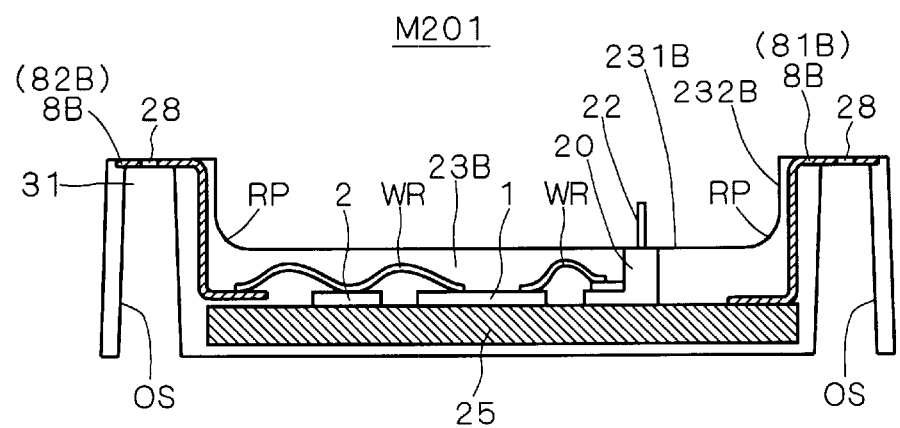
FIG. 10 is a cross section view showing the configuration of a modified example 1 of the semiconductor device according to the second preferred embodiment of the present invention.

FIG. 10 shows a cross section view of the configuration of the semiconductor device M201 as a modified example of the semiconductor device M200. The configuration of the semiconductor device M201 is essentially the same as that of the semiconductor device M200 which is described in reference to FIGS. 7 and 8 and the same symbols are attached to the same components and repetitive explanations are omitted.

The semiconductor device M201 is different from the semiconductor device M200 in the point that the bordering parts between the body part 231B and electrode protruding parts 232B are parts having curved surfaces RP with a curvature.

By adopting such a fillet structure in the case that the external conductors and the external connection electrode plates 8B are fastened with bolts in the electrode protruding parts 232B, the stress caused in the border parts between the body part 231B and the electrode protruding parts 232B becomes small even when the bolt is fastened through a large torque, so as to be able to withstand the fastening of bolts even though the dimensions of the electrode protruding parts 232B are small and, therefore, miniaturization of the semiconductor device can be achieved.

In addition, because of a similar reason, it is not necessary to make the thickness of the body part 231B large even in the case that a temperature change occurs due to the heat emission at the time of device utilization and warping of the entire resin package 23B can be prevented from occurring so that the effects of the heat radiation from the semiconductor device to the heat sink can be prevented from becoming lowered so that the temperature of the semiconductor device can be prevented from becoming of the allowed value or higher.

In addition, the resistance against the fastening of bolts is enhanced and the torque management for fastening of bolts becomes easy so as to increase the ease of assembly.

<B-5. Modified Example 2>

FIG. 11 shows a cross section view of the configuration of the semiconductor device M202 as a modified example of the semiconductor device M200. The configuration of the semiconductor device M202 is essentially the same as that of the semiconductor device M200 which is described in reference to FIGS. 7 and 8 and the same symbols are attached to the same components and repetitive explanations are omitted. In addition, the border parts between the body part 231B and the electrode protruding parts 232B are parts having curved surfaces RP in the same manner as in the semiconductor device M201 which is described in reference to FIG. 10.

The semiconductor device M202 has burring parts BP provided by means of a burring process around the through holes 28 created in the exposed parts of the external connection electrode plates 8B.

Then, threads are provided around these burring parts BP so that bolt fastening becomes possible without using nuts.

In the following, a burring process is described in reference to FIGS. 12 to 14. As shown in FIG. 12, a whole is created in the parts which become the exposed parts of the external connection electrode plates 8B by using a punch press PO, or the like. At this time, by pressing and spreading the external connection electrode plates 8B instead of removing them, walls are formed around the through holes 28.

Figure 13:
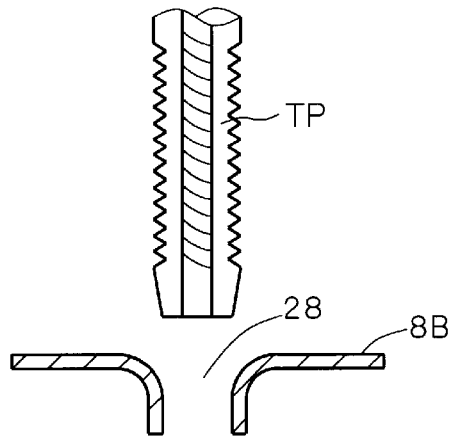
FIG. 13 is a schematic view showing a manufacturing process of the modified example 2 of the semiconductor device according to the second preferred embodiment of the present invention.
Figure 14:
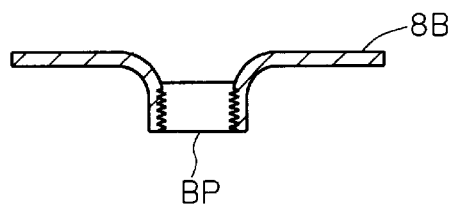
FIG. 14 is a schematic view showing a manufacturing process of the modified example 2 of the semiconductor device according to the second preferred embodiment of the present invention.

Then, as shown in FIG. 13, by using a tap TP for thread processing and by forming threads in the wall parts remaining around the holes, the burring parts BP which have threads as shown in FIG. 14 are gained.

<B-6. Modified Example 3>

Figure 15:
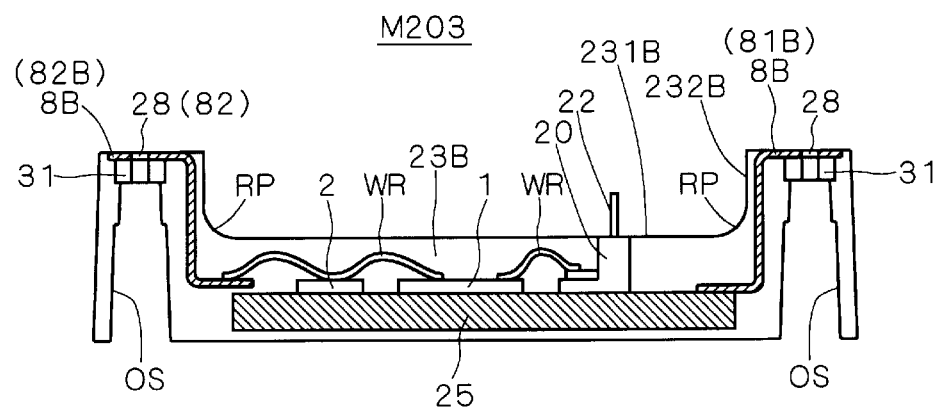
FIG. 15 is a cross section view showing the configuration of a modified example 3 of the semiconductor device according to the second preferred embodiment of the present invention.

FIG. 15 shows a cross section view of the configuration of the semiconductor device M203 as a modified example of the semiconductor device M200. The configuration of the semiconductor device M203 is essentially the same as that of the semiconductor device M200 which is described in reference to FIGS. 7 and 8 and the same symbols are attached to the same components and repetitive explanations are omitted. In addition, the border parts between the body part 231B and the electrode protruding parts 232B are parts having curved surfaces RP in the same manner as in the semiconductor device M201 which is described in reference to FIG. 10.

The semiconductor device M203 has nuts 31 on the lower surface side of the exposed parts of the external connection electrode plates 8B so that it is not necessary to prepare nuts at the time when external conductors are fastened with bolts (not shown) inserted from the through holes 28, increasing the ease of assembly.

The nuts 31 may be connected through soldering, or the like, to the lower surface of the external connection electrode plates 8B or may be buried in the cavities OS at the time when the resin package 23B is formed by means of transfer molding.

In the following, the process for burying the nuts 31 in the resin package 23B is described in reference to FIG. 16.

Figure 16:
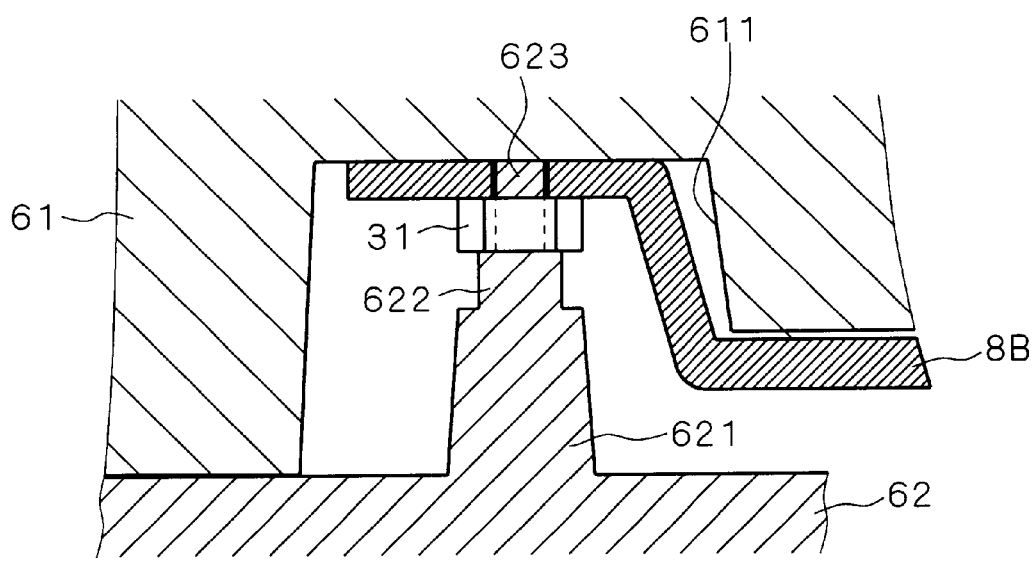
FIG. 16 is a cross section view showing a manufacturing process of the modified example 3 of the semiconductor device according to the second preferred embodiment of the present invention.

As shown in FIG. 16, an upper molding die 61, wherein a recess 611 which agrees with the external form of the electrode protruding parts 232B is provided, and a lower molding die 62, wherein a convex part 621 which agrees with the external form of the cavities OS is provided, are prepared in the part which corresponds to the electrode protruding parts 232B.

Pins 623 in a cylindrical form of which the diameter is slightly smaller than the diameter of the screw hole of the nuts 31 are provided at the tips of the lower molding die 62 and the convex part 621 so that the nuts 31 are inserted into those pins 623. The length of the pins 623 is set at a length such that the pins 623 slightly stick out from the end surface of the nuts 31 under the conditions where pins 623 are inserted into the nuts 31.

The convex part 621 is the part on which a nut 31 is mounted and has a base 622 in a cylindrical form of which the diameter is larger than the diameter of the screw hole of the nut 31 and is smaller than the outer diameter of the nut.

At the time of transfer molding the lead frame to which the heat spreader 25 is connected is placed between the upper molding die 61 and the lower molding die 62 under the condition where the pin 623 is inserted into the nut 31.

When the upper molding die 61 and the lower molding die 62 are closed, the nut 31 is fixed by being placed between the base 622 and the external connection electrode plate 8B while the pin 623 which has protruded from the end surface of the nut 31 is inserted into the through hole 28 in the external connection electrode plate 8B. Here, the length of the pin 623 is set such that the length of the part of the pin 623 which sticks out from the end surface of the nut 31 is shorter than the thickness of the external connection electrode plate 8B.

Accordingly, the pin 623 is contained within the through hole 28 and does not interfere with the upper molding die 61. By making a melt resin flow into the molding dies under this condition, the resin sealing is completed.

Here, since the nut 31 is placed between the base 622 and the external connection electrode plate 8B, the mold resin is prevented from entering into the inside of the nut 31.

In addition, since the upper surface of the external connection electrode plate 8B is pressed onto the upper molding die 61, the mold resin can be prevented from covering the upper surface of the external connection electrode plate 8B.

After the injected mold resin is cured, the upper molding die 61 and the lower molding die 62 are opened and the pins 623 are removed from the inside of the nuts 31 so that the edge surface and the thread hole of the nuts 31 are exposed.

Here, since the nuts 31 are buried in the mold resin, it is not necessary to fix the nuts 31 by using tools at the time of fastening with bolts so that the fastening of bolts can be easily carried out.

<C. Third Preferred Embodiment>
<C-1. Device Configuration>

Figure 17:
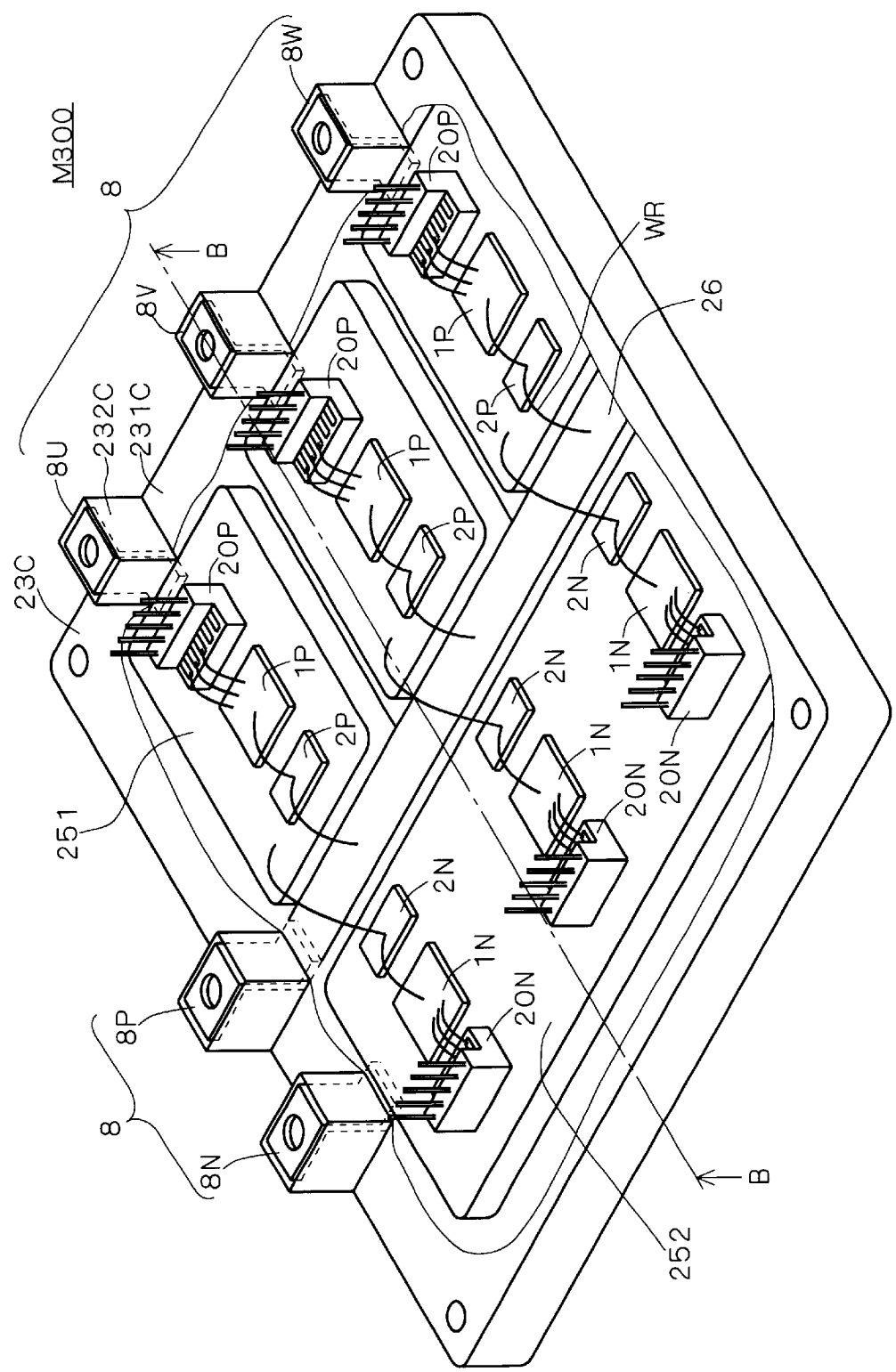
FIG. 17 is a perspective view showing the configuration of a semiconductor device according to a third preferred embodiment of the present invention.

FIG. 17 shows a perspective view of the configuration of the semiconductor device M300 as the third preferred embodiment according to the present invention. Here, in FIG. 17, part of a resin package 23C is omitted for the purpose of convenience so as to clearly show the internal configuration.

As shown in FIG. 17, the semiconductor device M300 shows a three phase bridge circuit which has six IGBT elements and six diode elements.

Then, the semiconductor device M300 has three heat spreaders 251 on which one each of the six IGBT elements and the six diode elements are provided as well as one heat spreader 252 on which three each of the six IGBT elements and the six diode elements are provided. The heat spreaders 251 and 252 are all in a rectangular form and the heat spreaders 251 are arranged in parallel so that the shorter sides are aligned while the heat spreader 252 has approximately the same size as the arranged heat spreaders 251 and is arranged such that the longer sides thereof are parallel to the aligned heat spreaders 251.

In addition, the semiconductor device M300 has a conductor plate 26 between the arranged heat spreaders 251 and the heat spreader 252.

Here, the IGBT elements and the diode elements which are provided on the heat spreader 251 are referred to as IGBT elements 1P and diode elements 2P while the IGBT elements and the diode elements which are provided on the heat spreader 252 are referred to as IGBT elements 1N and diode elements 2N.

On the main surface of each heat spreader 251 a relay terminal block 20P is provided outside of the IGBT element 1 and the relay terminal block 20P, the IGBT element 1P and the diode element 2P are aligned. Then, an external connection electrode plate 8 is connected to the outside of the relay terminal block 20P. Here, the external connection electrode plate 8 connected to each of the heat spreaders 251 is differentiated for the purpose of convenience by adding in order from the left the symbols 8U, 8V and 8W.

In addition, on the main surface of the heat spreader 252 three pairs of the IGBT elements 1N and the diode elements 2N which are aligned are provided with intervals so as to parallel to the shorter sides of the heat spreader 252.

Then, a relay terminal block 20N is provided on the outside of each of the IGBT elements 1N.

In addition, an external connection electrode plate 8N is connected to the peripheral part of one of the shorter sides of the heat spreader 252. Here, an external connection electrode plate 8P is connected to the peripheral part of one of the shorter sides of the conductor plate 26 so that the external connection electrode plates 8N and 8P exist in parallel. The external connection electrode plates 8N and 8P are referred to by the general term of external connection electrode plate 8.

Here, a plurality of aluminum wires WR make an electrical connection between the IGBT element 1P and the diode element 2P, between the IGBT element IP and the relay terminal block 20P, between the diode element 2P and the conductor element 26, between the IGBT element 1N and the diode element 2N, between the IGBT element 1N and the relay terminal block 20N and between the diode element 2N and each of the heat spreaders 251.

Then, the resin package 23C has a shape having five electrode protruding parts 232C on the upper surface of the body part 231C in a box shape such as the resin package 23B shown in FIG. 7 from which five external connection electrode plates 8, respectively, stick out.

Next, the configuration of the three phase bridge circuit is shown in reference to FIG. 18. As shown in FIG. 18, three pairs of IGBT elements 2P and 2N are connected in a totem pole manner between P–N lines (respective input terminals become 8P and 8N) which becomes a power line. Here, the input terminals 8P and 8N become the external connection electrode plates 8P and 8N shown in FIG. 17.

Each of the connection points of the IGBT elements which are, respectively, connected in a totem pole manner are connected to a load that is not shown. Here, these connection points, respectively, become the output terminals of the U phase, V phase and W phase, which become the external connection electrode plates 8U, 8V and 8W shown in FIG. 17.

In addition, free wheel diodes 2P and 2N are respectively connected to each of the IGBT elements 1P and 1N in reverse parallel.

<C-2. Manufacturing Method>

Figure 19:
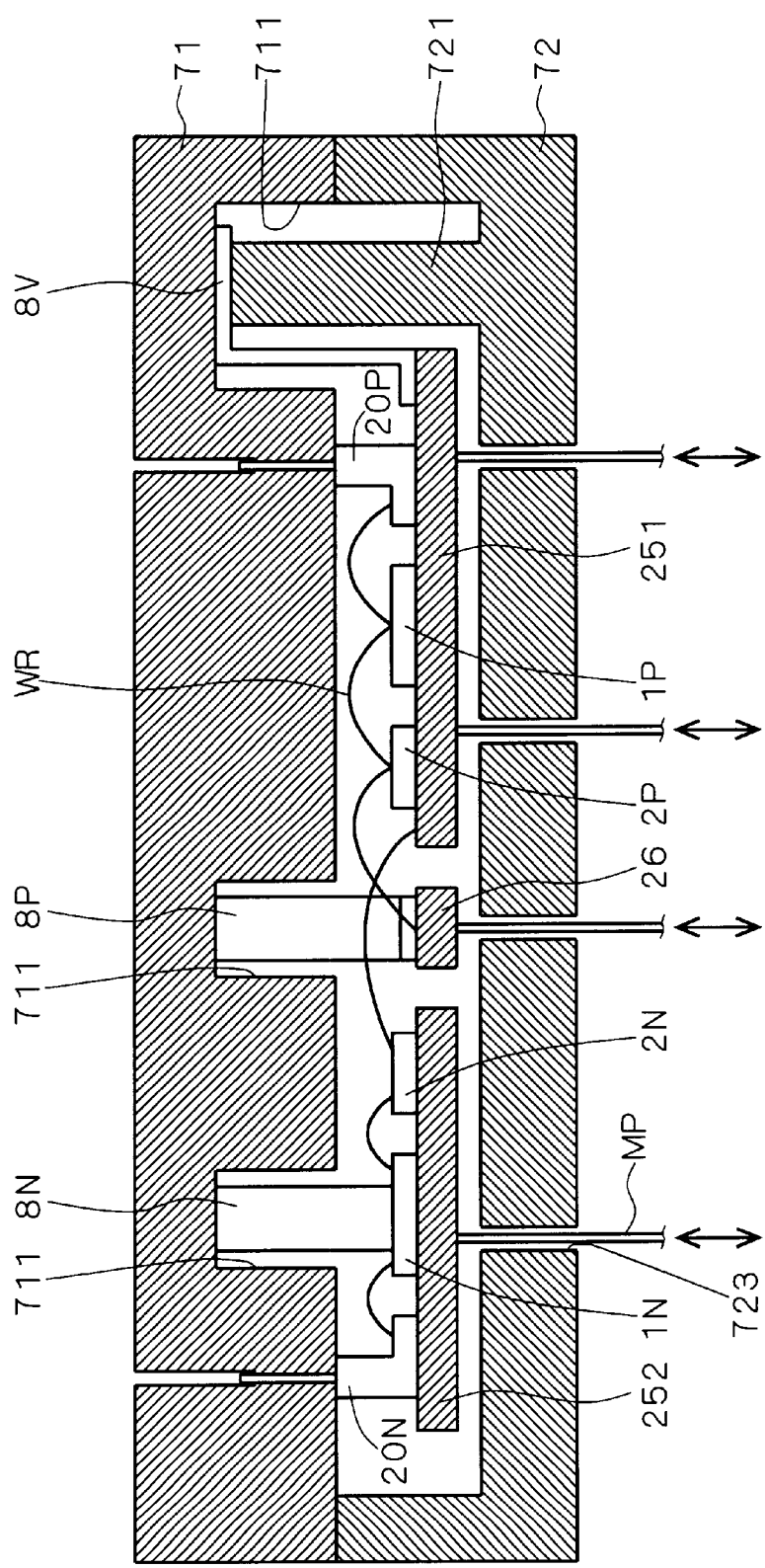
FIG. 19 is a cross section view showing a manufacturing process of the semiconductor device according to the third preferred embodiment of the present invention.

Next, a process for the semiconductor device M300 is described in reference to FIG. 19.

First, the IGBT element 1P, the diode element 2P and the relay terminal block 20P are connected to each of the three heat spreaders 251 by means of soldering and the IGBT element 1N, the diode element 2N and the relay terminal block 20N are connected to the heat spreader 252 by means of soldering.

In addition, external connection electrode plates 8U, 8V and 8W are connected to the three heat spreaders 251, respectively, by means of soldering and the external connection electrode plate 8N is connected to the heat spreader 252 by means of soldering and the external connection electrode plate 8P is connected to the conductor plate by means of soldering. In addition, aluminum wires WR are wire bonded to each component so as to electrically connect the components to each other.

Each of the external connection electrode plates 8 is formed integrally in the lead frame (not shown) surrounding the heat spreaders 251 and 252 and the lead frame, the heat spreaders 251, 252 and the conductor plate 26 are integrated by connecting each of the external connection electrode plates 8 to the heat spreaders 251, 252 and the conductor plate 26.

The lead frame is placed in a molding die for transfer molding under this condition and a melt resin is made to flow into the molding die so as to complete the resin sealing. FIG. 19 shows a cross section view along line B—B in FIG. 17 of the lead frame under the condition of being placed in the molding die.

As shown in FIG. 19, the molding die for transfer molding is made of an upper molding die 71 and a lower molding die 72 where the upper molding die 71 has a recess 711 which agrees with the external form of the electrode protruding part 232C and the lower molding die 72 has a convex part 721 which agrees with the external form of the cavity within the electrode protruding part 232 in the part corresponding to the electrode protruding part 232C.

Furthermore, a plurality of through holes 723 are created in the parts which correspond to the heat spreaders 251, 252 and the conductor plate 26 in the lower molding die 72 and movable pins MP that can be inserted from and removed to the outside are inserted into the though holes 723. Here, since the movable pins MP temporarily support the heat spreaders 251, 252 and the conductor plate 26, the diameter thereof may be approximately 1 mm to 2 mm and the through hole 723 are of the same size.

Under the condition where the heat spreaders 251, 252 and the conductor plate 26 are placed in the cavity defined by the upper molding die 71 and the lower molding die 72, the heat spreaders 251, 252 and the conductor plate 26 are supported by the movable pins MP, which contact the bottom surface thereof, and are also supported by each of the external connection electrode plates 8 so as to be held without fail.

Here, a through hole is created in the lead frame, which is not shown, for positioning and the position is fixed by inserting a positioning pin (not shown) into the through hole.

Then, a melt mold resin is injected into the cavity so as to gain the condition where the heat spreaders 251, 252 and the conductor plate 26 are held by the mold resin and, then, the movable pins MP are drawn down until the tips of the movable pins MP reach the same position as the inner wall surface of the lower molding die 72. The mold resin flows into the spaces from which the movable pins MP have been removed so that a resin layer without any gaps is formed in the lower parts of the heat spreaders 251, 252 and the conductor plate 26.

After this, the molding die is removed and each of the external connection electrode plates 8 is separated from the lead frame and, thereby, the semiconductor device M300, which is covered by the resin package 23C, can be gained.

<C-3. Working Effects>

In the semiconductor device M300 as described above, a three phase bridge circuit formed of a plurality of IGBT elements and diode elements is packaged so as to be very portable and the device area can be made small by making the intervals between the adjoining heat spreaders small in comparison with the case where a plurality of independent semiconductor devices as shown in FIG. 1 are combined so that miniaturization, lightening and cost reduction can be achieved.

<C-4. Modified Example>

Figure 20:
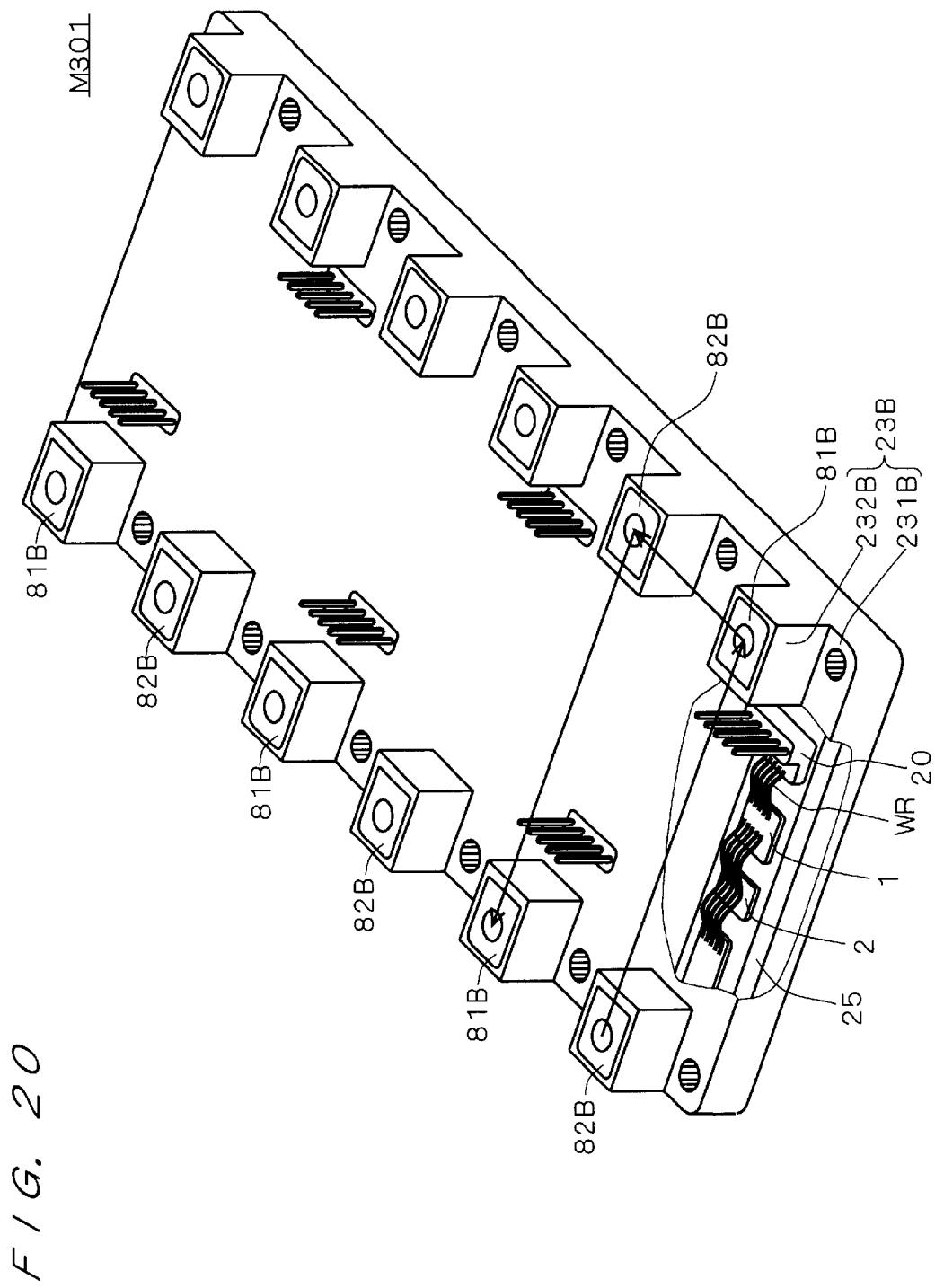
FIG. 20 is a perspective view showing the configuration of a modified example of the semiconductor device according to the third preferred embodiment of the present invention.

As for the configuration where a three phase bridge circuit formed of a plurality of IGBT elements and diode elements is packaged, such a configuration as of the semiconductor device M301 shown in FIG. 20 may be gained.

That is to say, the semiconductor device M301 corresponds to a configuration where six semiconductor devices M200 shown in FIG. 7 are arranged in an alternating manner so that the longer sides are parallel to each other and can be miniaturized by integrating the resin package 23B.

In addition, in the case that such a configuration is adopted, the area of a circuit loop (path shown as an arrow in FIG. 20) formed of a current path starting from the external connection electrode plate 82B and reaching to the external connection electrode plate 81B via the aluminum wire WR, the IGBT element 1 and the heat spreader 25 plus an external conductor, which is not shown, that makes a connection between the external connection electrode plate 81B and the adjoining external connection electrode plate 82B and, furthermore, a current path starting from the adjoining external connection electrode plate 82B and reaching to the external connection electrode plate 81B via the aluminum wire WR, the IGBT element 1 and the heat spreader 25 can be made small so that the amount of heat emitted by the semiconductor device M301 can be made small and, thereby, the area of the heat spreader 25 can be made small so that miniaturization, lightening and cost reduction of the entire device can be achieved.

Here, in order to use the semiconductor device M301 as a three phase bridge circuit, the external connection electrode plates 82B and the external connection electrode plates 81B are, respectively, connected in parallel by using an external conductor.

<D. Fourth Preferred Embodiment>
<D-1. Device Configuration>

Figure 21:
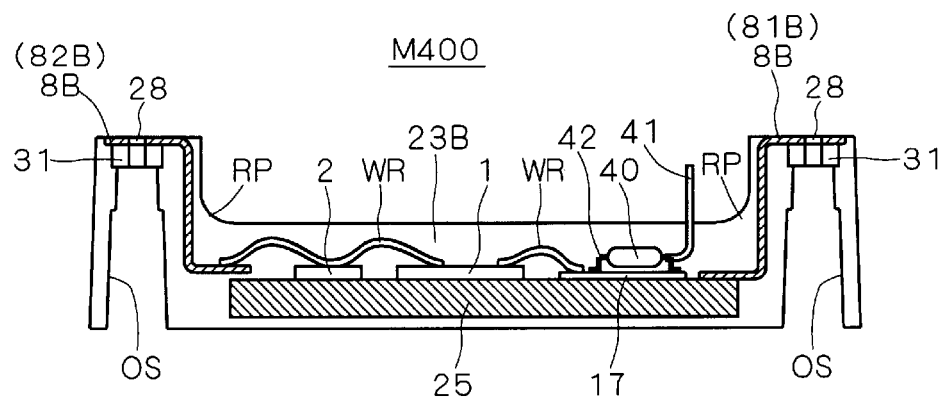
FIG. 21 is a cross section view showing the configuration of a semiconductor device according to a fourth preferred embodiment of the present invention.

FIG. 21 shows a cross section view of the configuration of the semiconductor device M400 as the fourth preferred embodiment according to the present invention. Here, in FIG. 21 the same symbols are attached to the same components as in the semiconductor device M200 described in reference to FIG. 7 and repetitive descriptions are omitted.

As shown in FIG. 21, the semiconductor device M400 has a control circuit substrate 17 instead of the relay terminal block 20 between the IGBT element 1 and the external connection electrode plate 81B on the main surface of the heat spreader 25. In the control circuit substrate 17, a predetermined conductor pattern is provided on the main surface of an insulating substrate and a control circuit 40 is electrically connected to this conductor pattern.

The control circuit 40 is packaged with a plurality of leads. Then, some of the leads are electrically connected to the IGBT element 1 via the above described conductor pattern and some other leads protrude to the outside from the resin package 23B as a relay pin terminal group 41.

<D-2. Working Effects>

The control circuit 40 is a circuit which controls the switching operation of the IGBT element 1 and by providing this control circuit 40 in the vicinity of the IGBT element 1 the area of the control wire loop formed between the control circuit 40 and the IGBT element 1 can be made small in comparison with the where it is provided outside of the semiconductor device.

Figure 22:
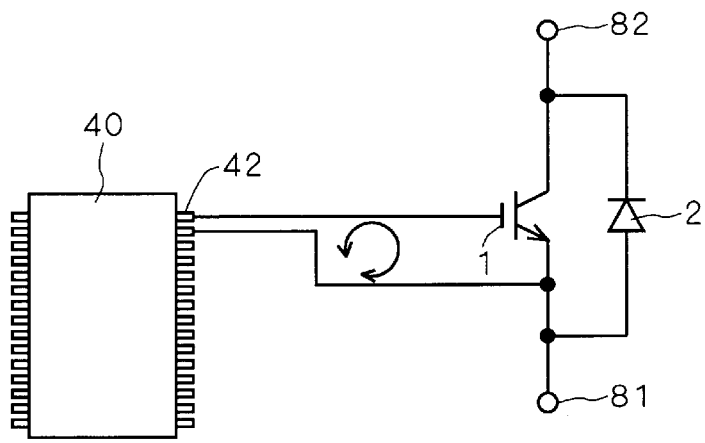
FIG. 22 is a schematic diagram for describing the effect of the fourth preferred embodiment of the present invention.

Here, FIG. 22 shows the above described control wire loop. In FIG. 22, the gate of the IGBT element 1 is connected to one of leads 42 of the control circuit 40 and the emitter of the IGBT element 1 is also connected to one of the leads 42 of the control circuit 40.

Accordingly, a wire loop if formed of the gate and the emitter of the IGBT element 1 and the control circuit 40.

Electromagnetic noise occurs not only from the IGBT element I but also from a variety of types of switching elements when they are operated in a turning on or turning off manner. The electromagnetic noise becomes greater in proportion to the main current which flows through the element and when this type of electromagnetic noise passes through the above described control wire loop, a voltage fluctuation occurs in the control signal. When this voltage fluctuation exceeds the operational threshold of a switching element a malfunction occurs.

However, by providing the control circuit 40 in the vicinity of the IGBT element 1, the area of the control wire loop formed between the control circuit 40 and the IGBT element I can be made small so that a voltage fluctuation can be prevented from occurring in the control signal even in the case that a large amount of electromagnetic noise occurs in the switching element for a heavy current which is the objective of the present invention.

In addition, by incorporating the control circuit 40 it becomes unnecessary to separately provide a control circuit substrate outside of the device and handling of the device becomes easy.

<D-3. Modified Example 1>

Figure 23:
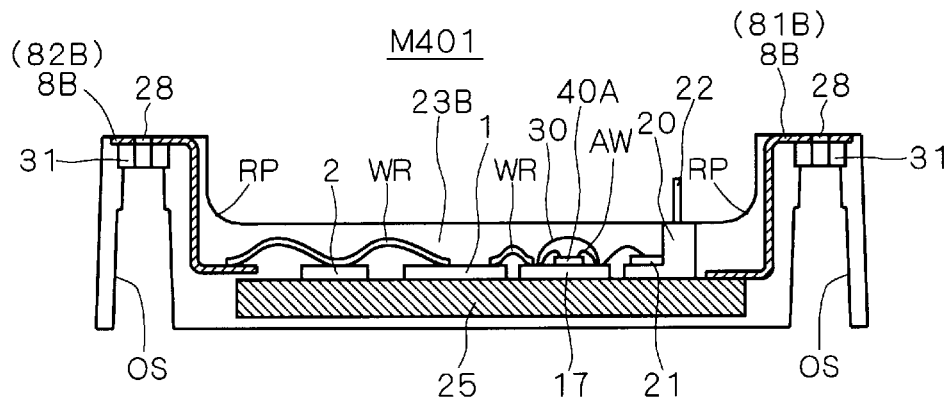
FIG. 23 is a cross section view showing the configuration of a modified example 1 of the semiconductor device according to the fourth preferred embodiment of the present invention.

Though in the semiconductor device M400 as described above, a configuration is shown where some of the leads 42 of the control circuit 40 are made to protrude to outside from the resin package 23B as a relay pin terminal group 41, the length of the leads is not as long as this in a general semiconductor package. Accordingly, it is necessary to fabricate the semiconductor device based on a special specification in order to gain a configuration such as a control circuit 40 and in the case that such a configuration as of the semiconductor device M401 shown in FIG. 23 is adopted, a control circuit under the condition of a semiconductor chip which is not packaged can be utilized.

That is to say, the semiconductor device M401 has a control circuit substrate 17 between the IGBT element 1 and the relay terminal block 20 on the main surface of the heat spreader 25 and a control circuit 40A is electrically connected to the conductor pattern on the control circuit substrate 17.

The control circuit 40A is in the condition of a semiconductor chip which is not packaged. Then, the control circuit 40A is electrically connected to the IGBT element 1 via the above described conductor pattern and is also electrically connected to the relay terminal plate group 21 of the relay terminal block 20 so as to be connected to the outside via the relay pin terminal group 22.

Here, the control circuit 40A and the conductor pattern on the control circuit substrate 17 are electrically connected through a gold wire AW and the control circuit 40A is covered with a cover resin 30 in a dome form in order to be protected from the pressure of the mold resin at the time of the sealing of the gold wire AW.

That is to say, in order to form the resin package 23B, a mold resin is made to flow into a molding die for transfer molding and a method is adopted such that the mold resin utilized herein is mixed with a fine powder of silica in order to make the heat greater, wherein the greater the content of silica becomes, the greater the viscosity becomes. In addition, in order to make the heat expansion ratio of the mold resin close to that of the heat spreader 25 it is necessary to make the silica content greater which results in a high viscosity.

Then, though a comparatively thick aluminum wire WR is utilized for each connection between the components on the heat spreader 25 so as to avoid warping or bending even when receiving pressure from the mold resin, the gold wire AW is thinner than the aluminum wire WR and is more malleable so there is a possibility of warping, bending or, in some cases, breaking due to pressure at the time of the introduction of the mold resin of which the viscosity is great.

Therefore, in the semiconductor device M401 the control circuit 40A is covered with the cover resin 30 and, thereby, the gold wires AW are protected.

Here, it is preferable to carry out wire bonding of the gold wires AW and the formation of the cover resin 30 before the mounting of the control circuit substrate 17 on the heat spreader 25 from the viewpoint of the prevention of distortion and damage of the gold wires AW at the time of handling.

In addition, it is necessary for the material of cover resin 30 to have a viscosity less than that of the mold resin of the resin package 23B and not to become deformed even at the time of transfer molding and, for example, a heat curing-type resin of which the glass transfer temperature is 200° C., or higher, which is the surrounding temperature at the time of transfer molding, is preferable and, more concretely, an epoxy based resin or a polyimide based resin is used. Here, a structure where a metal cap serves as a cover instead of resin may be used.

In addition, the cover resin 30 does not necessarily have to be formed in a dome form but, rather, for example, a dam may be provided around the control circuit 40A so that a resin is filled in inside the dam.

In addition, in the case that aluminum wires instead of gold wires AW are utilized, it is effective to provide the cover resin 30.

Here, though the control circuit substrate 17 is provided on the heat spreader 25, it is preferable for the heat from the heat spreader 25 to not be conveyed to the control circuit 40A from the viewpoint of maintaining the reliability of the control circuit 40A for a long period of time. Therefore, a protrusion is provided at the position where the control circuit substrate 17 is mounted on the heat spreader 25 so that a gap of several hundreds of $\mu$m is formed between the heat spreader 25 and the control circuit substrate 17 in order to make the heat resistance between the heat spreader 25 and the control circuit substrate 17 greater and, thereby, the temperature of the control circuit 40A is maintained at a low level.

Here, the mold resin is, of course, filled in into the gap between the heat spreader 25 and the control circuit substrate 17 and a protrusion may, of course, be provided on the control circuit substrate 17 instead of the heat spreader 25.

<D-4. Modified Example 2>

Figure 24:
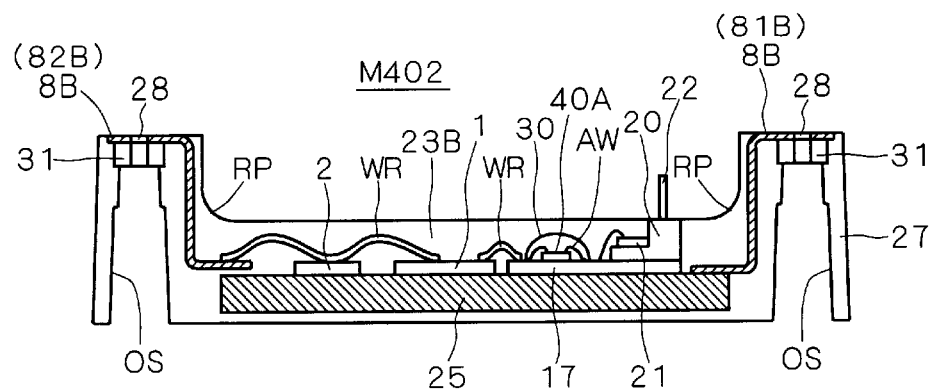
FIG. 24 is a cross section view showing the configuration of a modified example 2 of the semiconductor device according to the fourth preferred embodiment of the present invention.

Though in the semiconductor device M401 as described above a configuration is shown where only the control circuit 40A is provided on the control circuit substrate 17 and the relay terminal block 20 is provided on the heat spreader 25, such a configuration as of the semiconductor device M402 shown in FIG. 24 wherein the relay terminal block 20 is also provided on the control circuit substrate 17 may be used.

<E. Fifth Preferred Embodiment>

<E-1. Device Configuration>

Figure 25:
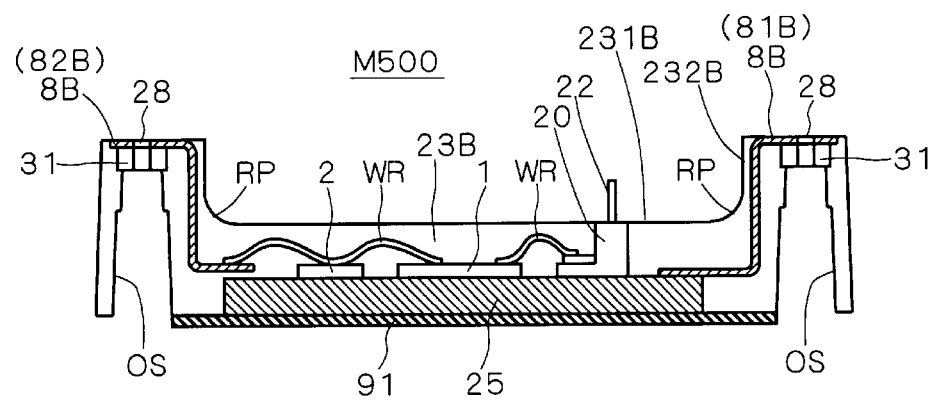
FIG. 25 is a cross section view showing the configuration of a semiconductor device according to a fifth preferred embodiment of the present invention.

FIG. 25 shows a cross section view of the configuration of the semiconductor device M500 as the fifth preferred embodiment according to the present invention. Here, in FIG. 25 the same symbols are attached to the same components as in the semiconductor device M200 described in reference to FIG. 7 and repetitive descriptions are omitted.

As shown in FIG. 25, in the semiconductor device M500 the bottom surface of the heat spreader 25 is exposed from the bottom surface of resin package 23B. Then, an insulating layer 91 is provided on the bottom surface of the resin package 23B so as to cover the exposed heat spreader 25.

As for the insulating layer 91 an adhesive, for example, applied to the surface of a sheet of an insulating material, such as a silicone resin, is utilized and this is adhered to the bottom surface of the resin package 23B.

Since silicone resin of the thickness of approximately 500 $\mu$m can achieve a withstand voltage of several KV, the insulation of the semiconductor device M500 by utilizing a silicone resin of a thickness that can achieve the desired withstand voltage even in the case that the semiconductor device M500 is mounted on a heat sink, which is not shown.

Here, in order to prevent a discharge at the interface of the resin package 23B and the silicone resin sheet, it is desirable to adhere the silicone resin sheet of which the area is larger than the area of heat spreader 25.

<E-2. Working Effects>

There is a technical problem with transfer molding wherein a gap of approximately several hundreds of $\mu$m is provided between the lower part of the heat spreader 25 and the molding die so that a mold resin is filled in into the gap without leaving a space.

That is to say, there is a gap of several mm, or more, between the upper part of the heat spreader 25 and the molding die in comparison with the gap of approximately several hundreds of $\mu$m between the lower part of the heat spreader 25 and the molding die. Therefore, the flow speed of the mold resin along the upper part of the heat spreader 25 is faster than the flow speed along the lower part so as to cause a phenomenon where the mold resin passes through the gap in the upper part of the heat spreader 25 and enters into the gap in the lower part.

As a result of this, the mold resin flows into the gap in the lower part of the heat spreader 25 by passing through different paths so as to form a region which is referred to as a weld in the part where they contact each other. In this case, there is a possibility of the formation of a void in the weld which becomes the cause of not being able to maintain a predetermined withstand voltage and a problem arises that the productivity is lowered.

Contrarily, by exposing the bottom surface of the heat spreader 25 from the bottom surface of the resin package 23B where the insulating layer 91 is provided, the above described problem does not occur and productivity can be enhanced.

<E-3. Modified Example 1>

Figure 26:
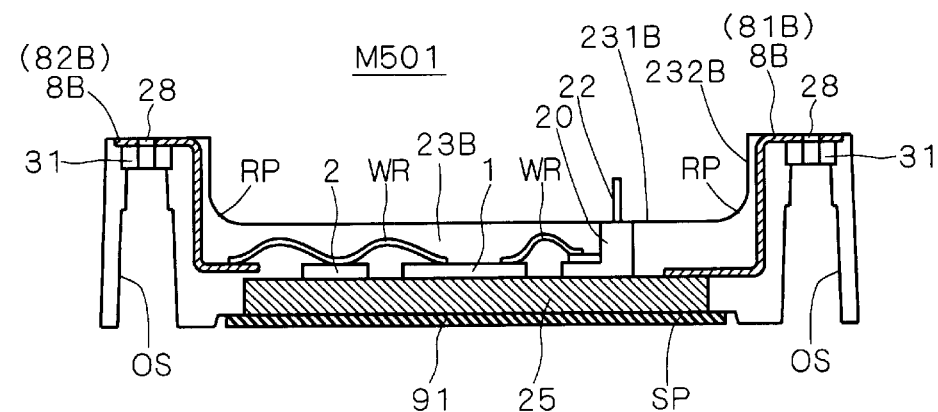
FIG. 26 is a cross section view showing the configuration of a modified example 1 of the semiconductor device according to the fifth preferred embodiment of the present invention.
Figure 29:
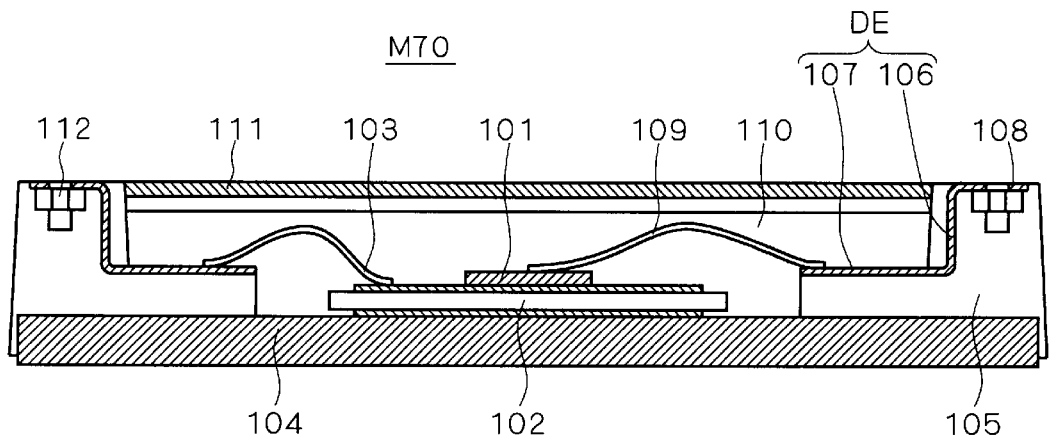
FIG. 29 to FIG. 31 are cross section views showing the configuration of a semiconductor device according to a prior art.
Figure 30:
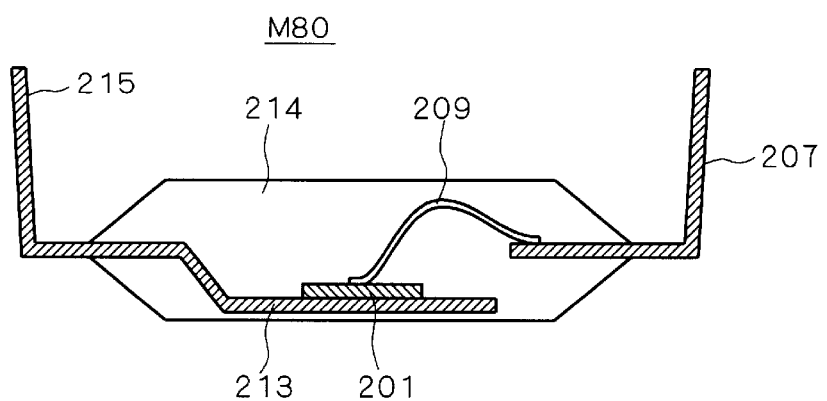
Figure 31:
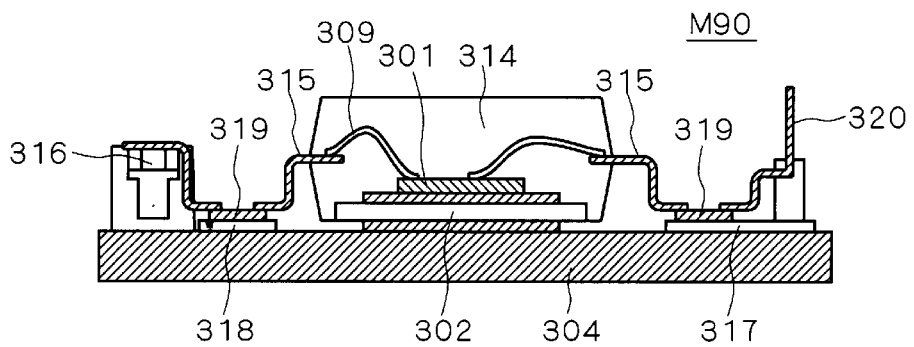

Though in the semiconductor device M500 as described above a configuration is shown where the insulating layer 91 is provided on the bottom surface of the resin package 23B, such a configuration as of the semiconductor device M501 shown in FIG. 26 may be used.

That is to say, the resin package 23B has step region SP of which the bottom surface spreads over a region slightly broader than the area of the heat spreader 25 and the bottom surface of the heat spreader 25 is exposed in this step region SP. Then, the height of the step region SP is smaller than the thickness of the insulating layer 91, that is to say, the thickness of the insulating sheet.

Therefore, when the insulating layer 91 is provided within the step region SP, the main surface of the insulating layer 91 sticks out from the step region SP and the insulating layer 91 compressed so that the thickness thereof becomes the same as the height of the step region SP by fastening the resin package 23B around the step region SP onto a heat sink, which is not shown, until complete contact is made to the heat sink with bolts, or the like, at the time when the semiconductor device M501 is attached to the heat sink.

Accordingly, by setting the height of the step region SP equal to the minimum thickness of the insulating sheet to secure the insulation and by fastening the bolts until the resin package 23B completely contacts the heat sink, the insulating sheet can be prevented from becoming thinner than the minimum thickness due to unevenness of fastening and it becomes unnecessary to include an additional margin to the thickness of the insulating sheet in order to increase radiation.

Then, since the radiation is increased the bottom area of the heat spreader 25 does not necessarily need to be made larger so that the device can be prevented from increasing in size.

<E-4. Modified Example 2>

Though in the semiconductor device M500 a configuration is shown where the insulating layer 91 is provided on the bottom surface of the resin package 23B, such a configuration as of the semiconductor device M502 shown in FIG. 27 may be used.

That is to say, on the bottom surface of the resin package 23B there are a plurality of protruding parts NP provided so as to surround the bottom surface of the heat spreader 25 and the insulating layer 91, that is to say the insulating sheet, is provided so as to cover the bottom surface of the heat spreader 25 in the region surrounded by the plurality of protruding parts NP. Then, the height of the protruding parts NP is smaller than the thickness of the insulating layer 91, that is to say the thickness of the insulating sheet.

Therefore, when the insulating layer 91 is provided in the region surrounded by the protruding parts NP, the main surface of the insulating layer 91 sticks out from the tips of the protruding parts NP and the insulating layer 91 is compressed so that the thickness thereof becomes the same as the height of the protruding parts NP by fastening bolts, or the like, until the tips of the protruding parts NP completely contact a heat sink, which is not shown, at the time when the semiconductor device M502 is attached to the heat sink.

Accordingly, by setting the height of the protruding parts NP equal to the minimum thickness of the insulating sheet to secure the insulation and by fastening bolts until the protruding parts NP completely contact the heat sink, the insulating sheet can be prevented from becoming thinner than the minimum thickness due to unevenness of fastening and it becomes unnecessary to include an additional margin to the thickness of the insulating sheet in order to increase radiation.

Then, since the radiation increases the bottom area of the heat spreader 25 is not necessarily made larger so that the device can be prevented from increasing in size.

Here, the protruding parts NP may be cylinders of which the diameter is approximately 2 mm and four to six of them may be provided for each side of the heat spreader 25. In addition, the protruding parts NP may be integrally formed within the resin package 23B.

<E-5. Modified Example 3>

Though in the semiconductor device M500 a configuration is shown where the insulating layer 91 is provided on the bottom surface of the resin package 23B, such a configuration as of the semiconductor device M503 shown in FIG. 28 may be used.

That is to say, the resin package 23B has a step region SP of which the bottom surface spreads over a region slightly broader than the area of the heat spreader 25 and the bottom surface of the heat spreader 25 is exposed in this step region SP. Then, the height of the step region SP is slightly smaller than the thickness of the insulating layer 91.

Here, the insulating layer 91 may be formed by adhering the above described insulating sheet and may be formed by using a method where a predetermined amount of insulating resin is applied by means of printing and a radiation plate BS is pressed on the insulating resin so that the insulating resin is spread to a uniform thickness. Here, by carrying out this process under a low pressure environment, the occurrence of void in the insulating layer 91 can be avoided.

Here, the application of resin by means of printing means to supply a melt insulating resin to a targeted region and to spread the resin by using a spatula, or the like, and in the semiconductor device M503 the height of step region SP is set equal to the minimum thickness of the insulating layer 91 and the insulating resin is spread to a degree where the thickness thereof slightly exceeds the height of the step region SP and the insulating resin is further spread to be uniform by being pressed by the radiation plated BS and, at the same time, the insulating layer 91 securely contacts the radiation plate BS.

Here, the radiation plate BS spreads not only the insulating resin but can also increase the radiation since the contact area with the heat sink increases by attaching the radiation plate BS of which the area is larger than the area of the heat spreader 25.

While the invention has been shown and described in detail, the foregoing description is in all aspects illustrative and not restrictive. It is therefore understood that numerous other modifications and variations can be devised without departing from the scope of the invention.

What is claimed is:

1. A semiconductor device comprising:
    a radiation substrate;
    semiconductor elements provided on said radiation substrate;
    a plurality of main electrode plates;
    a resin package configured to seal said radiation substrate, said semiconductor elements, and said plurality of main electrode plates in a resin;
    a first main electrode plate of said plurality of main electrode plates having one end electrically connected to a main electrode of the semiconductor elements and having another end exposed to an outside of an upper surface of said resin package; and
    a second main electrode plate of said plurality of main electrode plates having one end electrically connected to said radiation substrate and having another end exposed to said outside of the upper surface of said resin package,
    wherein said resin package is integrally formed by a molding technique.

2. The semiconductor device according to claim 1, wherein
    said resin package is in a box shape; and
    a main surface of said other end of each of said plurality of main electrode plates alone is exposed on the upper surface of said resin package.

3. The semiconductor device according to claim 2, wherein the exposure position of said main surface of said other end of each of said plurality of main electrode plates is a position near a center of the upper surface of said resign package.

4. The semiconductor device according to claim 1, wherein
    said resin package has a body part in a box shape and a plurality of protruding electrode parts which, respectively, protrude from the upper surface of the body part and contain said plurality of main electrode plates within the inside; and
    said main surface of said other end of each of said plurality of main electrode plates alone is exposed on the upper surface of each of said plurality of protruding electrode parts.

5. The semiconductor device according to claim 4, wherein
    said plurality of protruding electrode parts are formed so that the bordering parts between said plurality of protruding electrode parts and said body part have curved surfaces.

6. The semiconductor device according to claim 4, wherein
    said plurality of protruding electrode parts are provided at peripheral parts of said body part and have cavities inside thereof; and
    said other end of each of said plurality of main electrode plates is provided so as to cover the upper of each of said cavities.

7. The semiconductor device according to claim 6, wherein
    said other end of each of said plurality of main electrode plates has a through hole; and
    said through hole has a thread around the inner surface thereof.

8. The semiconductor device according to claim 7, wherein
    said through hole is created by means of a burring process; and
    said thread is provided on a burring part which protrudes to the side of said cavity by means of said burring process.

9. The semiconductor device according to claim 6, wherein
    said other end of each of said plurality of main electrode plates has a through hole; and
    said plurality of protruding electrode parts further have nuts buried therein so that the thread of each of the nuts are connected to that of said through hole.

10. The semiconductor device according to claim 1, further comprising
    a control circuit which is provided on said radiation substrate and which carries out a driving control of said semiconductor elements.

11. The semiconductor device according to claim 10, wherein said control circuit is covered with a resin of which the viscosity is smaller than that of the mold resin of said resin package.

12. The semiconductor device according to claim 1, wherein
- a bottom surface of said radiation substrate, that is the opposite side of the surface on which said semiconductor elements are mounted, is exposed from the bottom surface of said resin package; and
- said semiconductor device further comprises an insulating layer provided on the side of said bottom surface of said resin package so as to, at least, completely cover said bottom surface of said radiation substrate.

13. The semiconductor device according to claim 12, wherein said insulating layer is formed of an insulating material in a sheet form attached to the bottom surface of said resin package.

14. The semiconductor device according to claim 12, wherein
- said bottom surface of said resin package has a step region which is recessed and corresponds to the exposure region of said bottom surface of said radiation substrate;
- the depth of said step region is lower than the thickness of said insulating layer.

15. The semiconductor device according to claim 12, wherein
- said bottom surface of said resin package has a plurality of protruding parts which are provided so as to surround the exposure region of said bottom surface of said radiation substrate;
- the height of said a plurality of protruding parts is lower than the thickness of said insulating layer.

16. The semiconductor device according to claim 12, further comprising
- a radiation plate which closely contacts on said insulating layer and of which the area is broader than that of said insulating layer.

17. A semiconductor device comprising:
- a plurality of radiation substrates;
- semiconductor elements respectively provided on said plurality of radiation substrates;
- a plurality of main electrode plates of which one end is electrically connected to a main electrode of each of said semiconductor elements, respectively; and
- a resin package for sealing said plurality of radiation substrates, said semiconductor elements and said plurality of main electrode plates in a resin,
- wherein the other end of each of said plurality of main electrode plates is exposed to the outside of the upper surface of said resin package; and
- wherein said resin package is integrally formed by means of molding.

18. The semiconductor device according to claim 17, wherein all of said plurality of radiation substrates have a same rectangular shape and are arranged so that the long sides thereof are parallel to each other.

* * * * *